(12) United States Patent
Lo et al.

(10) Patent No.: US 12,259,604 B2
(45) Date of Patent: Mar. 25, 2025

(54) SILICON-BASED OPTICAL DEVICE AND METHOD OF FABRICATING THE SAME

(71) Applicant: TAIWAN SEMICONDUCTOR MANUFACTURING COMPANY LTD., Hsinchu (TW)

(72) Inventors: Wen-Shun Lo, Hsinchu County (TW); Jing-Hwang Yang, Hsinchu County (TW); Yingkit Felix Tsui, Cupertino, CA (US)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 104 days.

(21) Appl. No.: 18/191,859

(22) Filed: Mar. 28, 2023

(65) Prior Publication Data
US 2024/0329435 A1    Oct. 3, 2024

(51) Int. Cl.
*G02F 1/01*   (2006.01)
*G02B 6/12*   (2006.01)
*H01L 21/762*   (2006.01)

(52) U.S. Cl.
CPC ............ *G02F 1/0147* (2013.01); *G02F 1/011* (2013.01); *G02B 6/12033* (2013.01);
(Continued)

(58) Field of Classification Search
CPC .. G02F 1/011; G02F 1/0147; G02F 2201/122; G02B 2006/12135
See application file for complete search history.

(56) References Cited

U.S. PATENT DOCUMENTS

| | | | | |
|---|---|---|---|---|
| 5,291,565 A | * | 3/1994 | Schaffner | G02F 1/2255 385/3 |
| 2005/0058425 A1 | * | 3/2005 | Berini | B82Y 20/00 385/147 |

(Continued)

FOREIGN PATENT DOCUMENTS

CN          114578585 A  *  6/2022

OTHER PUBLICATIONS

S. Y. Siew et al., "Review of Silicon Photonics Technology and Platform Development", Journal of Lightwave Technology, Jul. 1, 2021, pp. 4374-4389, vol. 39, No. 13.
(Continued)

*Primary Examiner* — Michael Stahl
(74) *Attorney, Agent, or Firm* — WPAT LAW; Anthony King

(57) ABSTRACT

A method of fabricating an optical device comprises steps of forming a silicon-based optical component in a substrate; depositing an ILD layer on the substrate and the silicon-based optical component; forming a thermal tuning assembly comprising a first metallic material in the ILD layer and above the silicon-based optical component, wherein the thermal tuning assembly comprises a core above the silicon-based optical component, a plurality of grids spaced apart from the core, and a pair of neck portions connecting the grids to the core, wherein a width of a strip in each grid is greater than a width of the core; forming at least one conductive plug comprising the first metallic material penetrating the ILD layer and coupled to the silicon-based optical component; and forming a plurality of conductive lines comprising a second metallic material coupled to the thermal tuning assembly.

20 Claims, 26 Drawing Sheets

(52) U.S. Cl.
CPC .............. *G02B 2006/12061* (2013.01); *G02B 2006/12083* (2013.01); *G02B 2006/12135* (2013.01); *G02F 2201/122* (2013.01); *H01L 21/762* (2013.01)

(56) References Cited

U.S. PATENT DOCUMENTS

| | | | |
|---|---|---|---|
| 2008/0007681 A1* | 1/2008 | Chen ................. | G02F 1/133707 349/129 |
| 2008/0044124 A1* | 2/2008 | Sugiyama ............ | G02F 1/2255 385/3 |
| 2012/0087613 A1* | 4/2012 | Rasras ................. | G02F 1/2257 257/E31.124 |
| 2019/0004342 A1* | 1/2019 | Iida ....................... | G02F 1/0147 |
| 2021/0132462 A1* | 5/2021 | Lin ....................... | G02F 1/0147 |
| 2022/0179055 A1* | 6/2022 | Ferrara ................ | G02B 6/4269 |

OTHER PUBLICATIONS

Steven A. Miller et al., "Tunable frequency combs based on dual micro-ring resonators", Optics Express, Aug. 10, 2015, pp. 21527-21540, vol. 23, No. 16.

Paolo Pintus et al., "PWM-Driven Thermally Tunable Silicon Microring Resonators: Design, Fabrication, and Characterization", Laser & Photonics Reviews, Sep. 10, 2019, vol. 13, Issue 9.

* cited by examiner

SILICON-BASED OPTICAL DEVICE AND METHOD OF FABRICATING THE SAME

BACKGROUND

Modern technology advances, such as big data, cloud computation, cloud storage, and the Internet of Things (IoT), have driven exponential growth of various applications in processing and communication of data, e.g., high-performance computers, data centers, and long-haul telecommunication. To address emerging needs of high-data-rate transmission, a modern semiconductor structure may include optical elements for providing optical data links to improve data transmission rates of existing electrical data links.

Silicon photonics is poised to provide a fast on-chip and off-chip optical link for data communication that has low cost and high energy efficiency. In development of incorporating optical data links in a semiconductor device, a challenge of tuning wavelengths of optical signals using a thermal-optic effect has attracted a great deal of attention.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, dimensions of the various structures may be arbitrarily increased or reduced for clarity of discussion.

DETAILED DESCRIPTION

Figure 1:
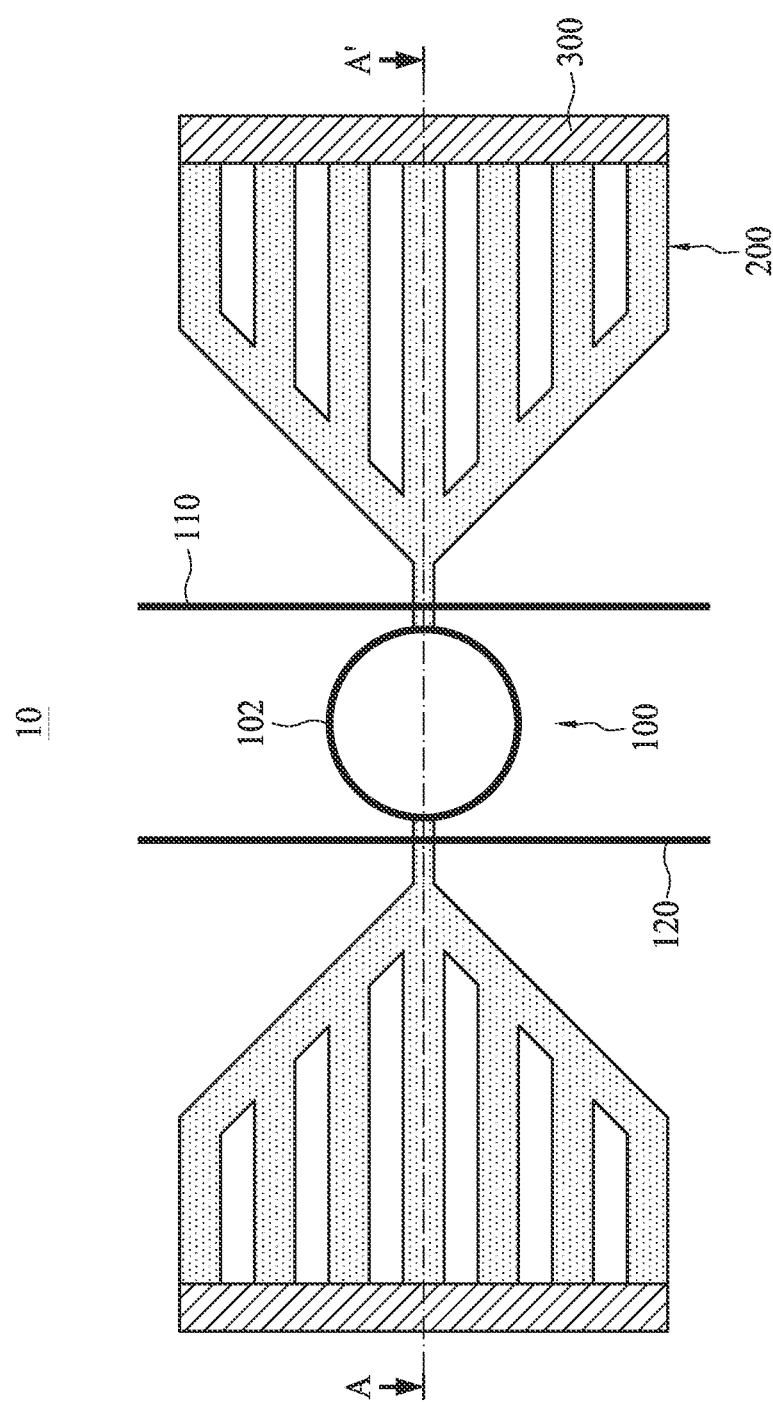
FIG. 1 is a top view of a silicon-based optical device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" or "substantially" generally mean within 10%, 5%, 1% or 0.5% of a given value or range. Alternatively, the terms "about," "substantial" or "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

According to embodiments of the present disclosure, an optical device and a method of fabricating an optical device are provided. Specifically, the optical device includes an optical modulator and a thermal tuning member in the vicinity of the optical modulator to manipulate optical properties of an optical signal within the optical modulator by way of a thermo-optical effect on refractive index. The optical device may be implemented with a silicon-based material due to the material's low transmission loss and compatibility with existing semiconductor fabrication operations.

Figure 2:
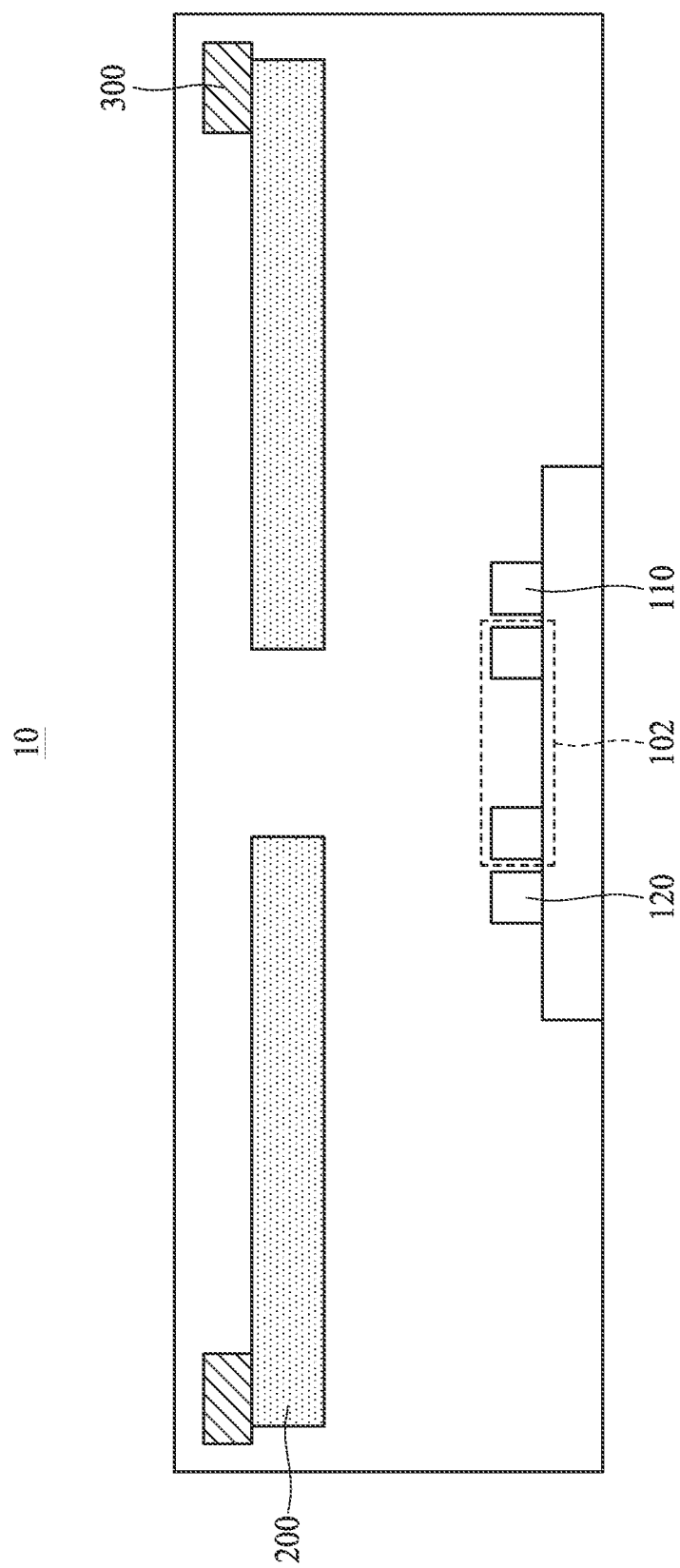
FIG. 2 is a cross-sectional view taken along a line A-A' in FIG. 1.

FIG. 1 is a top view of a silicon-based optical device 10 in accordance with some embodiments of the present disclosure, and FIG. 2 is a cross-sectional view taken along a line A-A' in FIG. 1. In some embodiments, the silicon-based optical device 10 is part of an optical link used to transmit high-speed data with a modulated light beam, wherein the optical link is configured to transmit an electrically-modulated optical signal between two or more electrical devices. In some embodiments, the optical link including the silicon-based optical device 10 is incorporated into a semiconductor package and configured to convert electrical signals to optical signals, and vice versa, between interconnected electrical devices. The silicon-based optical device 10 includes a modulator 100, an input waveguide 110, an output waveguide 120, and a thermal tuning member 200 used to adjust a temperature of the modulator 100, thereby changing a wavelength of an optical signal within the modulator 100.

In some embodiments, the modulator 100 is a ring modulator that includes a ring waveguide 102. The input waveguide 110 and the output waveguide 120 are positioned on either side of the ring waveguide 102. It should be noted that the ring modulator is described herein merely by way for example, and any other suitable type of modulator may alternatively be used. The modulator 100 has a resonant wavelength. For example, a value of the resonant wavelength of the ring modulator depends, among other parameters, on a length of a perimeter of the ring modulator. The resonant wavelength is given approximately by:

$$\lambda_i = \frac{2\pi rn}{i}$$

where r is a radius of the ring modulator, n is the optical waveguide's effective index, and i is an integer.

In addition, an effective refractive index may be approximated by:

$$n = n_0 + \left(\frac{dn}{dT}\right)\Delta T$$

where $n_0$ is an effective index at an initial temperature $T_0$, dn/dT is a rate of change of a refractive index at temperature $T_0$, and $\Delta T$ is a net change in temperature $T-T_0$.

The resonant wavelength of the modulator 100 may be changed by raising or lowering a temperature of the ring waveguide 102. More particularly, the thermal tuning member 200 generates heat when a current is supplied. Therefore, when the current is supplied to the thermal tuning member 200, the ring waveguide 102 of the modulator 100 is heated so that a refractive index of the ring waveguide 102 can be changed. Consequently, the resonant wavelength of the modulator 100 can be adjusted.

Figure 3:
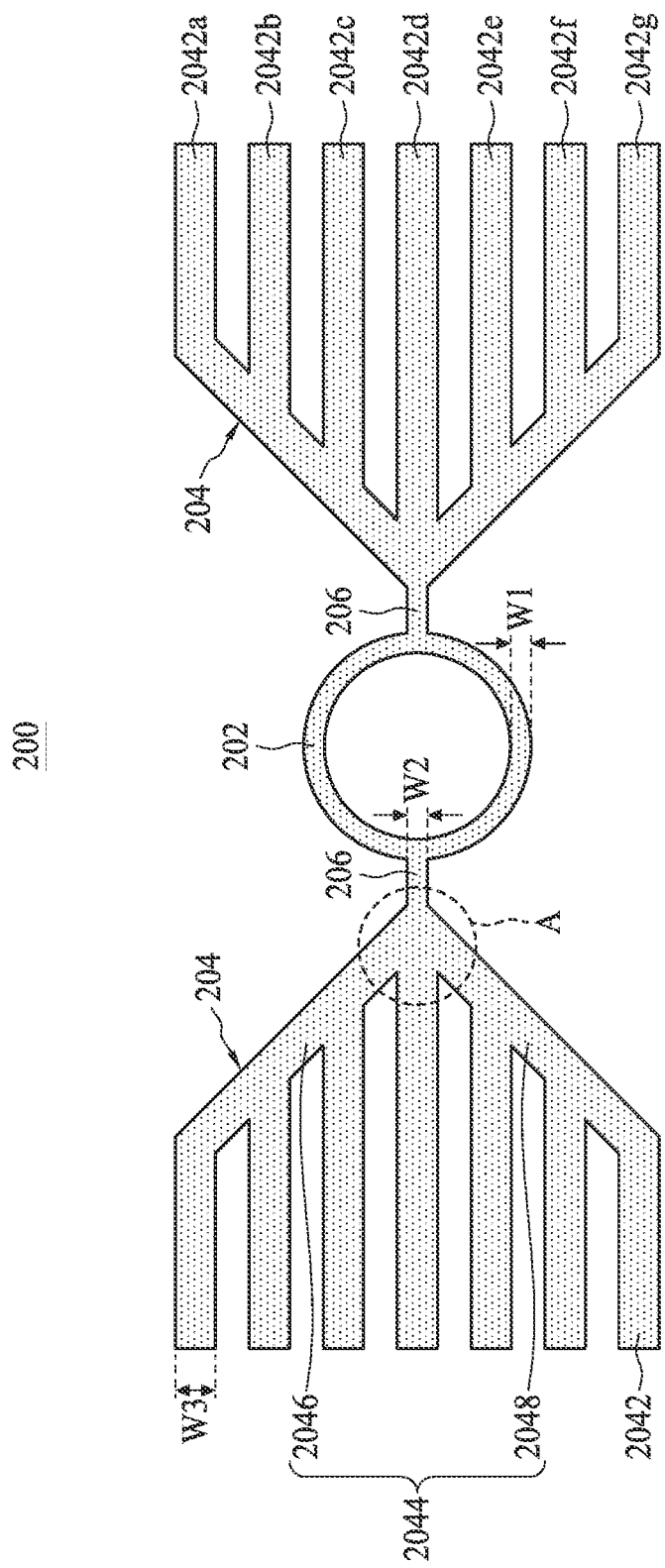
FIG. 3 is a top view of a thermal tuning member, in accordance with some embodiments of the present disclosure.

FIG. 3 is a top view of the thermal tuning member 200, in accordance with some embodiments of the present disclosure. Referring to FIG. 3, the thermal tuning member 200, configured to generate heat sufficient to increase a temperature of the modulator 100, includes a core 202, a pair of grids 204 spaced apart from the core 202, and a pair of neck portions 206 connecting the grids 204 to the core 202. In some embodiments, the pair of grids 204 and the pair of neck portions 206 are arranged symmetrically, such that a symmetrical thermal distribution is obtained when a current is applied to the thermal tuning member 200. The current supplied to the thermal tuning member 200 is conducted from one of the grids 204 to another of the grids 204 through the connected core 202 and neck portions 206. In some embodiments, the core 202, the pair of grids 204, and the pair of neck portions 206 are integrally formed and have substantially a same thickness. In some embodiments, the thermal tuning member 200 comprises tungsten.

In some embodiments, each grid 204 includes a plurality of strips 2042a to 2042g, wherein the strips 2042a to 2042g are equally spaced and parallel to one another, and a connecting portion 2044 connecting the strips 2042a to 2042g to one of the neck portions 206. In some embodiments, the pair of grids 204 are arranged on either side of the core 202, and the strips 2042a to 2042g extend parallel to the neck portions 206. Referring to FIGS. 1 to 3, the strips 2042a to 2042g of each grid 204 are physically connected to a metal line 300 formed of a metal, e.g., copper, which has a melting temperature less than that of the thermal tuning member 200, which may be formed of tungsten, for example.

Referring back to FIG. 3, the core 202 may have a shape that follows a shape of the modulator 100, and the core 202 is arranged to overlap the modulator 100 from a view above the thermal tuning member 200. Therefore, there is a need for the core 202 to generate more heat and the strips 2042 to generate less heat when the current is supplied to the thermal tuning member 200 to accurately control the temperature and optimize a heating energy required for bringing the modulator 100 to a desired temperature.

Generally, a higher electrical resistance of a conductor correlates to more heat being generated as a current passes through the conductor. In addition, a cross-sectional area of the conductor is inversely proportional to its resistance. As described above, the core 202, the grids 204 and the neck portions 206 have substantially the same thickness, so that the cross-sectional area of the core 202, the strips 2042a to 2042g and the neck portions 206 are determined by their widths. In some embodiments, a ring of the core 202 has a first width W1, the neck portion 206 has a second width W2 greater than the first width W1, and each of the strips 2042a to 2042g has a third width W3 greater than the second width W2 to provide more efficient thermal tuning, as well as electrical stability (e.g., improve electromigration (EM) reliability). For example, the first width W1 is between about 0.2 μm and about 0.7 μm, and the second width W2 is between about 1 μm and about 2 μm.

Figure 4:
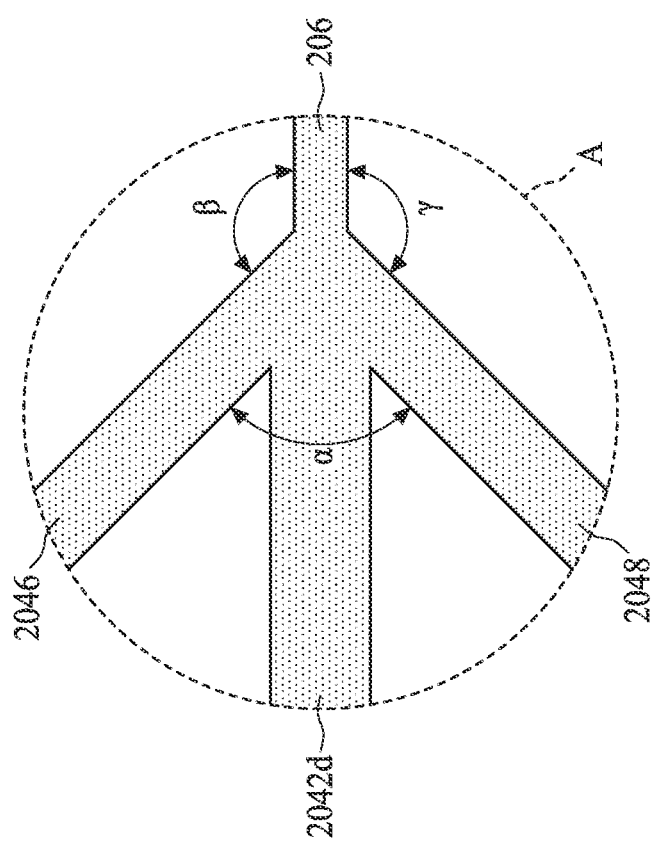
FIG. 4 is an enlarged view of an area A of FIG. 3.

In some embodiments, the strips 2042a to 2042g in each grid 204 have decreasing lengths from a center toward two sides. For example, when each grid 204 includes an odd number of the strips 2042a to 2042g, the central strip 2042d has a greatest length, and the strips 2042a and 2042g farthest away from the central strip 2042d have a shortest length. The strips 2042a to 2042g have a length ranging from about 10 μm to about 20 μm. The connecting portion 2044 includes a first segment 2046 and a second segment 2048 connected to one other. The central strip 2042d and the strips 2042a, 2042b and 2042c disposed at an upper side of the central strip 2042d are connected to the first segment 2046, and the central strip 2042d and the strips 2042e, 2042f and 2042g disposed at a lower side of the central strip 2042d are connected to the second segment 2048. FIG. 4 is an enlarged view of an area A of FIG. 3. Referring to FIG. 4, in some embodiments, an angle α between the first segment 2046 and the second segment 2048 may be an acute angle, an obtuse angle or a right angle. In some embodiments, an angle β between the first segment 2046 and the respective neck portion 206 is an obtuse angle, and an angle γ between the second segment 2048 and the respective neck portion 206 is also an obtuse angle.

As described above, the core 202 generates more heat and the strips 2042a to 2042g generate less heat, so that the heat in the core 202 may radiate to the strips 2042a to 2042g or conduct to the strips 2042a to 2042g through the neck portions 206. Generally, radiation intensity is inversely proportional to a square of a distance, so that the heat radiated to the strips 2042a, 2042b, 2042c, 2042c, 2042f and 2042g disposed at two sides of the central strip 2042d is less than a heat radiated to the central strip 2042d. As such, a heat conducted to the central strip 2042d from the core 202 and through the respective neck portion 206 may be rapidly dissipated for preventing the metal lines 300 connecting the strips 2042a to 2042g (as shown in FIGS. 1 and 2) from incurring electromigration. In some embodiments, each of the metal lines 300 is arranged perpendicular to the strips 2042a to 2042g being connected. In some embodiments, the core 202 of the thermal tuning member 200 is arranged directly over the ring waveguide 102 of the modulator 100 to achieve a desirable heating performance on the modulator 100 with uniform heat distribution while conducting as little heat as possible to other parts of the optical link or to metals in the semiconductor device 10. In some embodiments, the core 202 of the thermal tuning member 200 substantially overlaps the ring waveguide 102 of the modulator 100.

Figure 5:
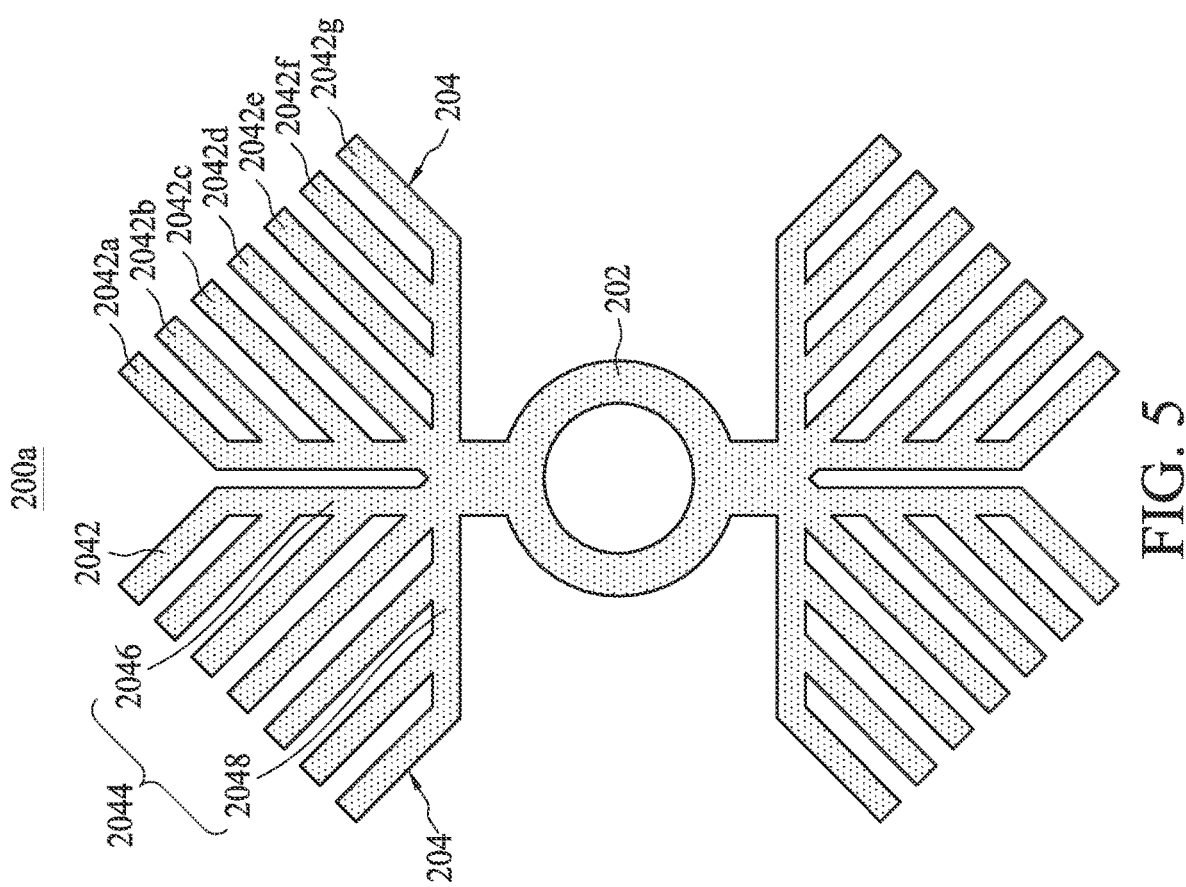
FIG. 5 is a top view of a thermal tuning member, in accordance with some embodiments of the present disclosure.

Referring to FIG. 5, the thermal tuning member 200a includes a core 202, a plurality of grids 204 spaced apart from the core 202, and a pair of neck portions 206 connecting the plurality of grids 204 to the core 202. The thermal tuning member 200a includes four grids 204, and each neck portion 206 is configured to connect a pair of grids 204 to the core 202. The grids 204 and the pair of neck portions 206 are arranged symmetrically, such that a symmetrical thermal distribution is obtained when a current is supplied to the thermal tuning member 200a. In some embodiments, the current supplied to the thermal tuning member 200a is conducted from an upper pair of the grids 204 to the neck portion 206 connected to the upper pair of the grids 204, then to the core 202, and finally to a lower pair of the grids 204 through another neck portion 206. In some embodiments, the core 202 has a ring shape, and the neck portions 206 are disposed on either side of the core 202.

Each grid 204 includes a plurality of strips 2042a to 2042g and a connecting portion 2044 connecting the strips 2042a to 2042g to the respective neck portion 206. The strips 2042a to 2042g may have decreasing lengths from a center toward two sides, so that when the grid 204 includes an odd number of the strips 2042a to 2042g, a central strip 2042d can have a greatest length. The connecting portion 2044 may include a first segment 2046 and a second segment 2048; the first segment 2046 connects the central strip 2042d and some of the strips 2042a, 2042b and 2042c disposed at one side of the central strip 2042d, and the second segment 2048 connects the central strip 2042d and the strips 2042e, 2042f, and 2042g disposed at another side of the central strip 2042d. One of the first and second segments 2046 and 2048 is arranged parallel to the neck portions 206, and another of the first and second segments 2046 and 2048 is arranged perpendicular to the neck portions 206.

Figure 6:
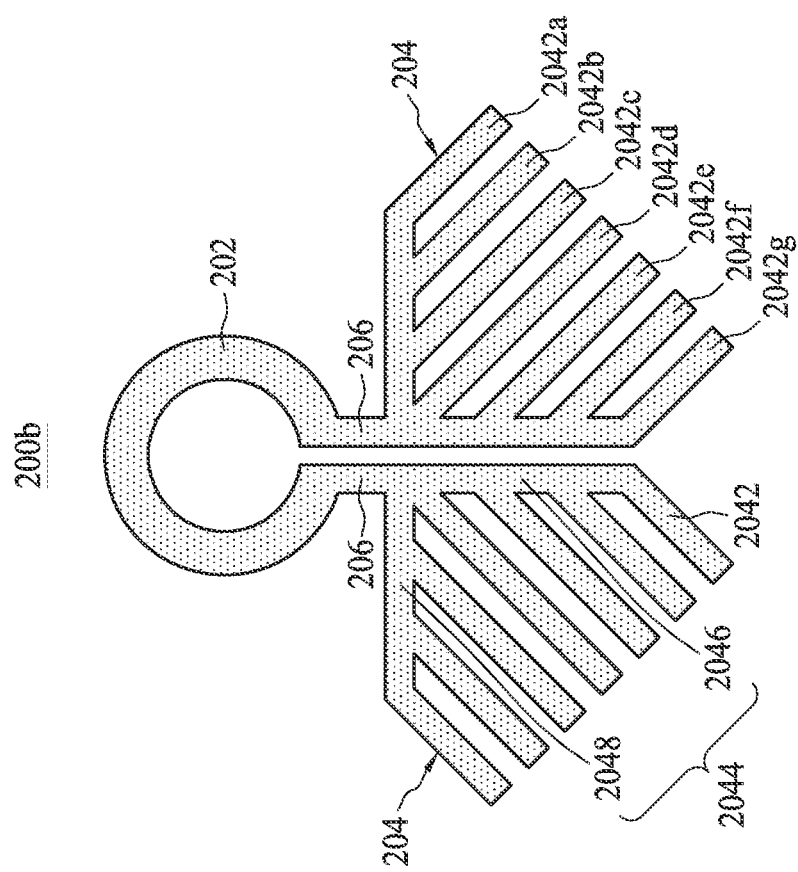
FIG. 6 is a top view of a thermal tuning member, in accordance with some embodiments of the present disclosure.

Referring to FIG. 6, a thermal tuning member 200b includes a core 202, a pair of grids 204 spaced apart from the core 202, and a pair of neck portions 206 connecting the pair of grids 204 to the core 202. In some embodiments, the pair of grids 204 and the pair of neck portions 206 are arranged symmetrically, such that a symmetrical thermal distribution is obtained when a current is applied to the thermal tuning member 200b. The current supplied to the thermal tuning member 200b is conducted from one of the grids 204 (e.g., the left grid 204) to the one of the neck portions 206 connected to the left grid 204, then to the core 202, and finally to the right grid 204 through another of the neck portions 206. In some embodiments, the core 202 has a C shape, and the pair of neck portions 206 are connected to open ends of the C-shaped core 202. In other words, the pair of grids 204 are arranged side-by-side.

In some embodiments, each grid 204 includes a plurality of strips 2042a to 2042g and a connecting portion 2044 connecting the strips 2042a to 2042g to the respective neck portion 206. The strips 2042a to 2042g may have decreasing lengths from a center toward two sides, so that when the grid 204 includes an odd number of the strips 2042a to 2042g, a central strip 2042d can have a greatest length. The connecting portion 2044 may include a first segment 2046 and a second segment 2048; the first segment 2046 connects the central strip 2042d and some of the strips 2042a, 2042b and 2042c disposed at one side of the central strip 2042, and the second segment 2048 connects the central strip 2042d and the strips 2042e, 2042f and 2042g disposed at another side of the central strip 2042d. One of the first and second segments 2046 and 2048 is arranged parallel to the neck portions 206, and another of the first and second segments 2046 and 2048 is arranged perpendicular to the neck portions 206.

Figure 7:
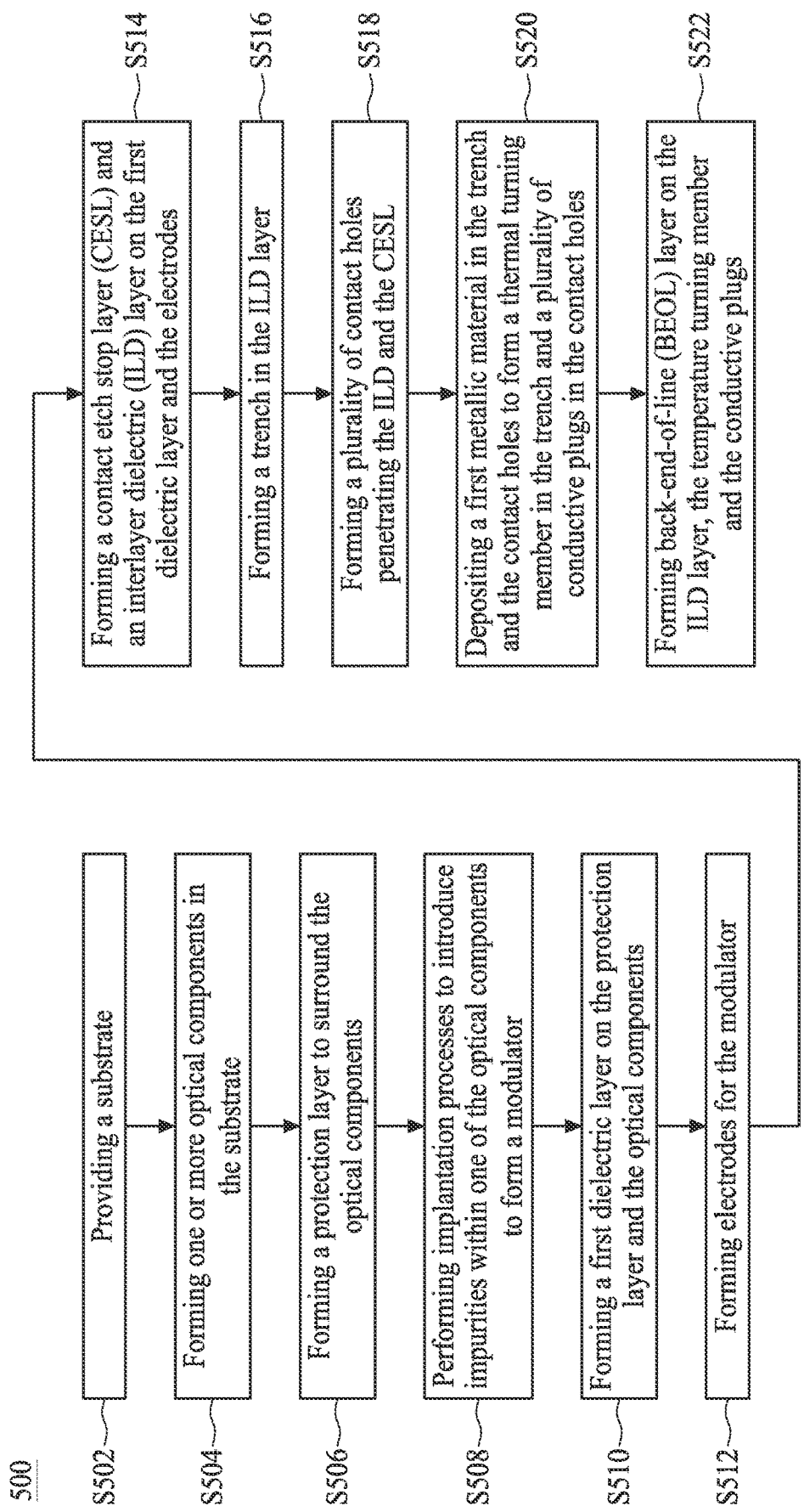
FIG. 7 is a flowchart of a method of fabricating a silicon-based optical device, in accordance with some embodiments of the present disclosure.

FIG. 7 is a flow diagram illustrating a method 500 of fabricating a silicon-based optical device in accordance with some embodiments of the present disclosure, and FIGS. 8 to 26 illustrate intermediate stages in the formation of the silicon-based optical device in accordance with some embodiments of the present disclosure. The stages shown in FIGS. 8 to 26 are also illustrated schematically in the flow diagram in FIG. 7. In the subsequent discussion, the fabrication stages shown in FIGS. 8 to 26 are discussed in reference to operation steps shown in FIG. 7. Additional steps can be provided before, during, and after the stages shown in FIGS. 8 to 26, and some steps described below can be replaced or eliminated in other embodiments of the method 500. An order of the steps may be interchangeable. Some of the steps may be performed concurrently or independently.

Figure 8:
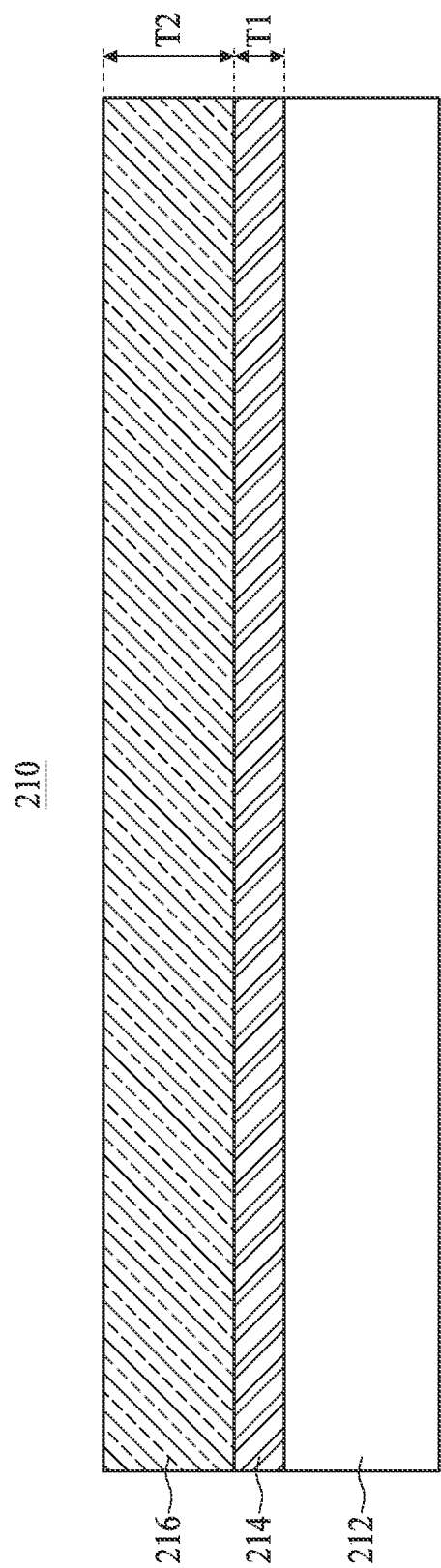
FIG. 8 is a cross-sectional view of an intermediate stage of a method of fabricating a silicon-based optical device, in accordance with some embodiments of the present disclosure.

Referring to FIG. 8, a substrate 210 is received or provided according to a step S502 in FIG. 7. The substrate 210 includes silicon. In some embodiments, the substrate 210 is a silicon-on-insulator (SOI) substrate in which a silicon wafer 212, an insulating layer 214 and a silicon layer 216 are formed. The insulating layer 214, for example, includes silicon oxide, silicon nitride or other suitable dielectric materials. In some embodiments, the insulating layer 214 may have a first thickness T1 of about 2 μm, and the silicon layer 216 may have a second thickness T2 of about 220 nm.

Figure 9:
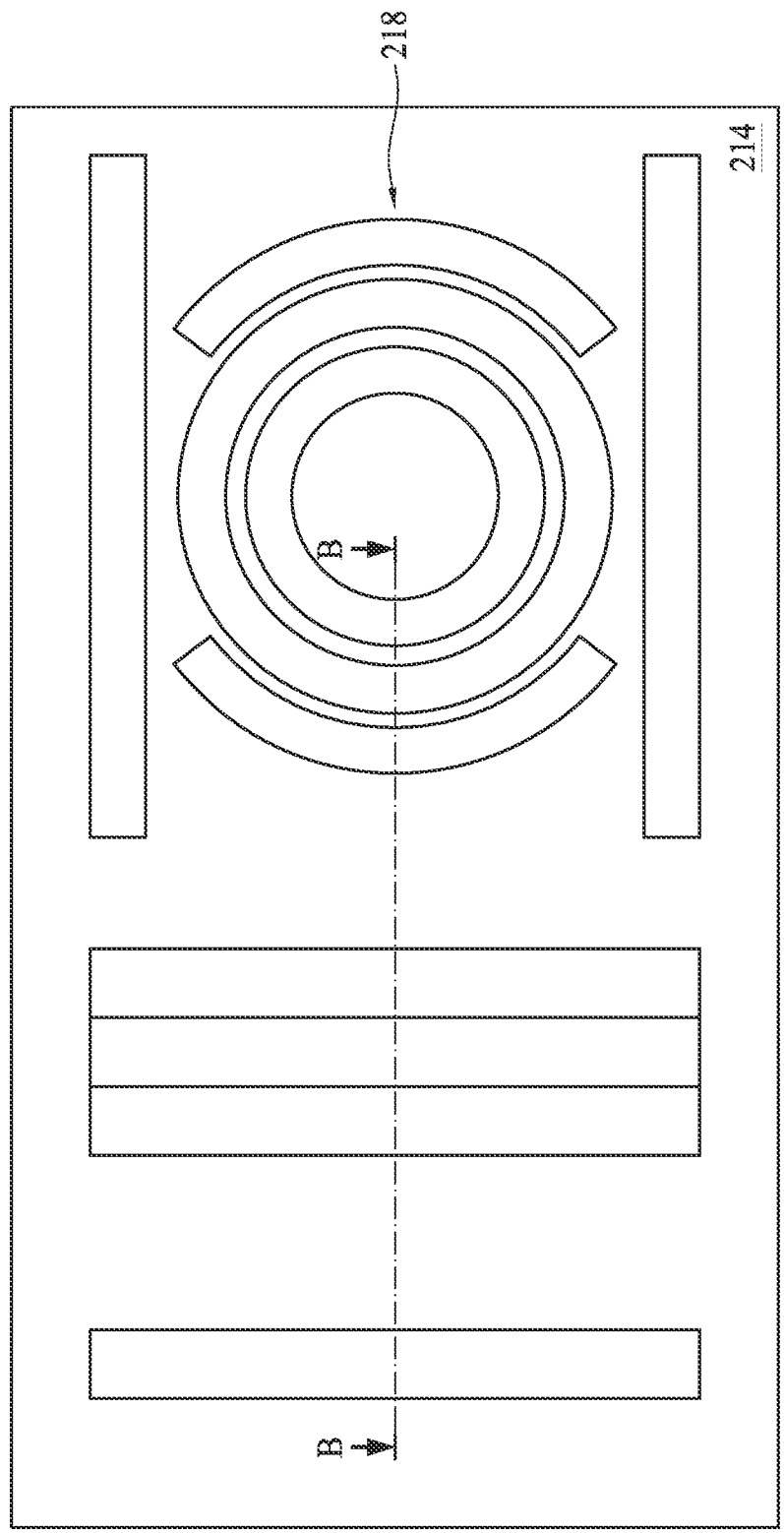
FIG. 9 is a plan view of an intermediate stage of the method of fabricating the silicon-based optical device, in accordance with some embodiments of the present disclosure.
Figure 10:
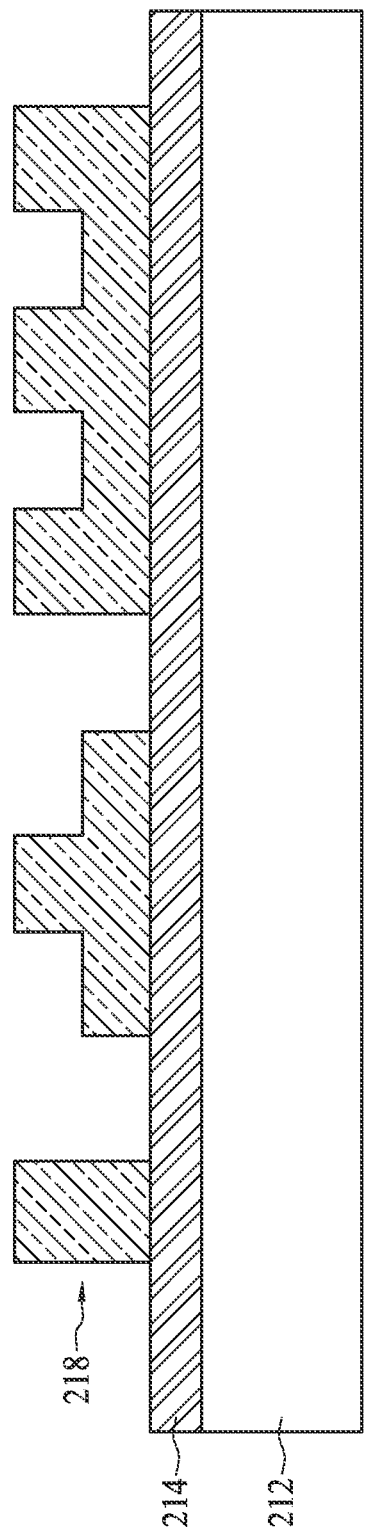
FIG. 10 is a cross-sectional view taken along a line B-B' in FIG. 9.

Referring to FIGS. 9 and 10, the silicon layer 216 is etched to form one or more optical components 218 according to a step S504 in FIG. 7. In some embodiments, at least one photolithography operation is used to earmark regions where the optical components 218 are to be formed, and one or more etching operations are applied to remove portions of the silicon layer 216, leaving the earmarked regions in place to thereby form the optical components 218. For the etching of the silicon layer 216, a reactive ion etching operation may, for example, be applied. The optical components 218 may include, from left to right, a strip waveguide, a rib waveguide, and a ring waveguide for formation of a modulator, as described below.

Figure 11:
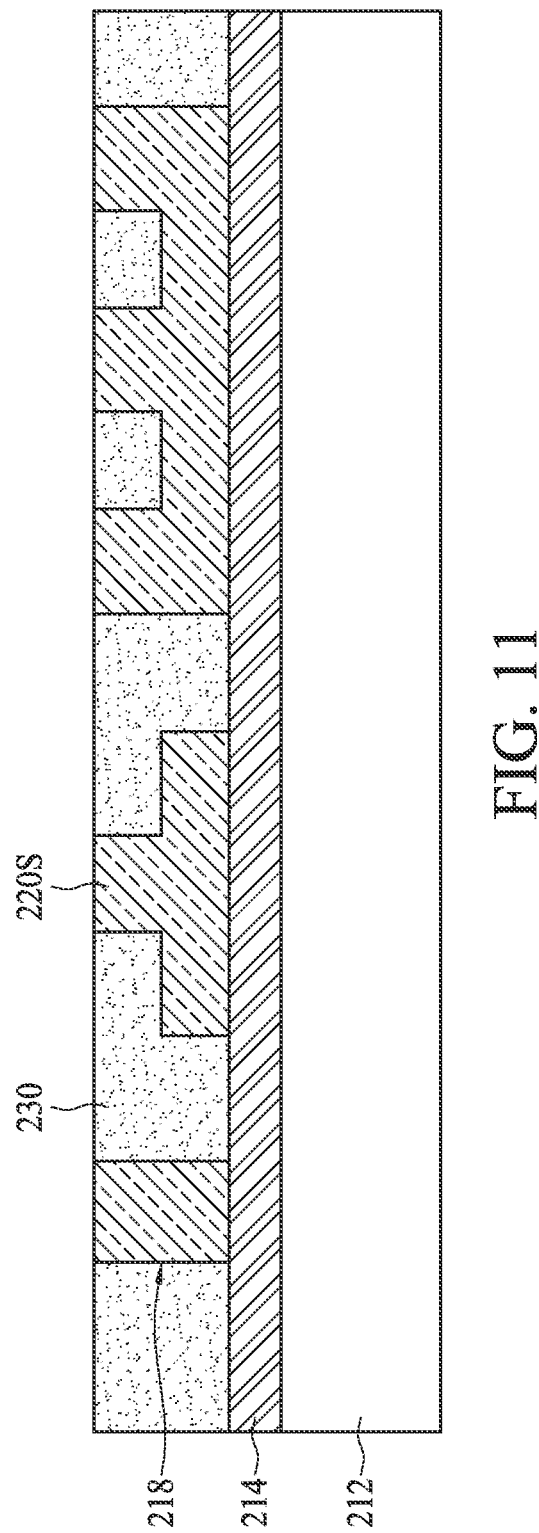
FIGS. 11 to 26 are cross-sectional views of intermediate stages of the method of fabricating the silicon-based optical device, in accordance with some embodiments of the present disclosure.

Referring to FIG. 11, according to a step S506 in FIG. 7, a protection layer 230 is formed over the substrate 210 to surround the optical components 218. The protection layer 230, including oxide, may be formed by any acceptable deposition operation, such as a chemical vapor deposition (CVD) operation or a high-density plasma (HDP) CVD operation. After the deposition operation is performed, the protection layer 230 may cover the insulating layer 214 and the optical components 218. Accordingly, an additional planarization operation, such as a chemical mechanical polishing (CMP) operation or a grind operation, may be performed, so as to obtain the structure shown in FIG. 11, in which a top surface of the protection layer 230 is planarized and top surfaces 220S of the optical components 218 are exposed through the protection layer 230.

Figure 12:
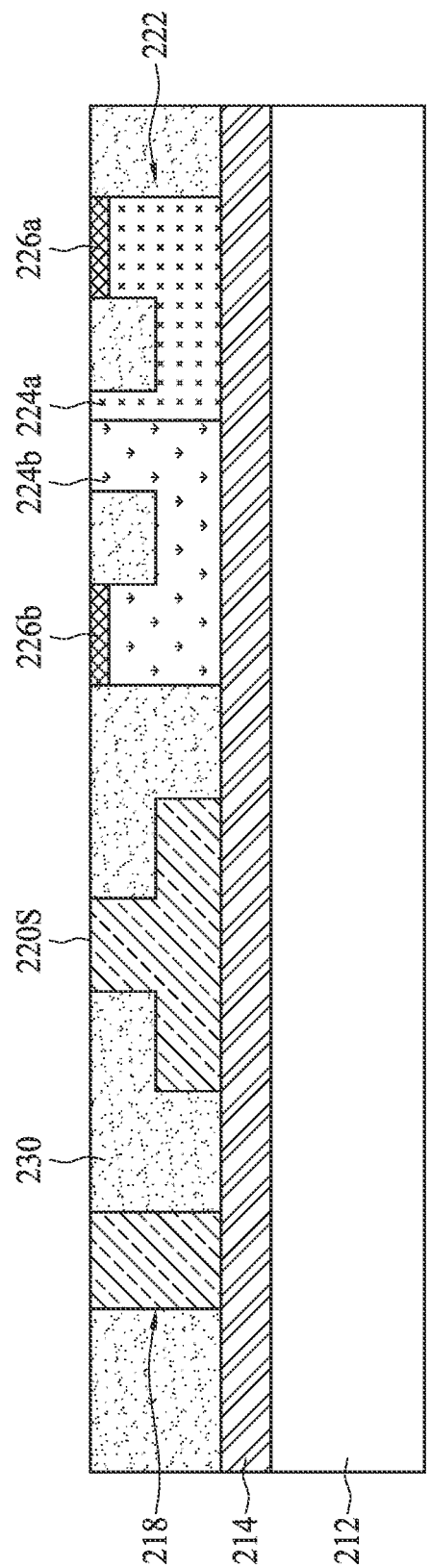

Referring to FIG. 12, according to a step S508 in FIG. 7, implantation operations are performed to introduce impurities into the optical components 218, as part of formation of the modulator 222. The modulator 222 may include a first region 224a having a first conductivity type (e.g., n-type) and a second region 224b abutting the respective first region 224a and having a second conductivity type (e.g., p-type) different from the first conductivity type. In some embodiments, the modulator 222 is formed in separate processing sequences that include, for example, masking the second region 224b and the other optical components 218 when implanting n-type impurities into the first region 224a and masking the first region 224a and the other optical components 218 when implanting p-type impurities into the second region 224b. A PN junction may thus be formed within the modulator 222. N-type impurity concentrations of the first region 224a and p-type impurity concentrations of second region 224b may be set at substantially same levels. In some embodiments, an anneal operation (such as a rapid thermal annealing (RTA) operation) may be performed to repair implantation damage and to activate the p-type and n-type impurities that were implanted.

In order to form a low-resistance contact with the first region 224a and the second region 224b of the modulator 222, an n+ region 226a and a p+ region 226b are formed in the first region 224a and the second region 224b, respectively. It can be seen that the n+ region 226a is formed on a top part of the first region 224a except for a region where the PN junction is located, and the p+ region 226b is formed on a top part of the second region 224b except for the region where the PN junction is located. The n+ region 226a has an impurity concentration greater than that of the first region 224a and the p+ region 226b has an impurity concentration greater than that of the second region 224b. In some embodiments, the n+ region 226a and the p+ region 226b are formed in separate processing sequences that include, for example, masking the optical components 218 while excluding a portion of the n+ region 226a spaced apart from the PN junction when implanting n-type impurities into the portion of the first region 224a, and masking the optical components 218 while excluding a portion of the second region 224b spaced apart from the PN junction when implanting p-type impurities into the second region 224b. In some embodiments, an anneal operation may be performed to activate the p-type and n-type impurities that were implanted in the n+ region 226a and the p+ region 226b.

Figure 13:
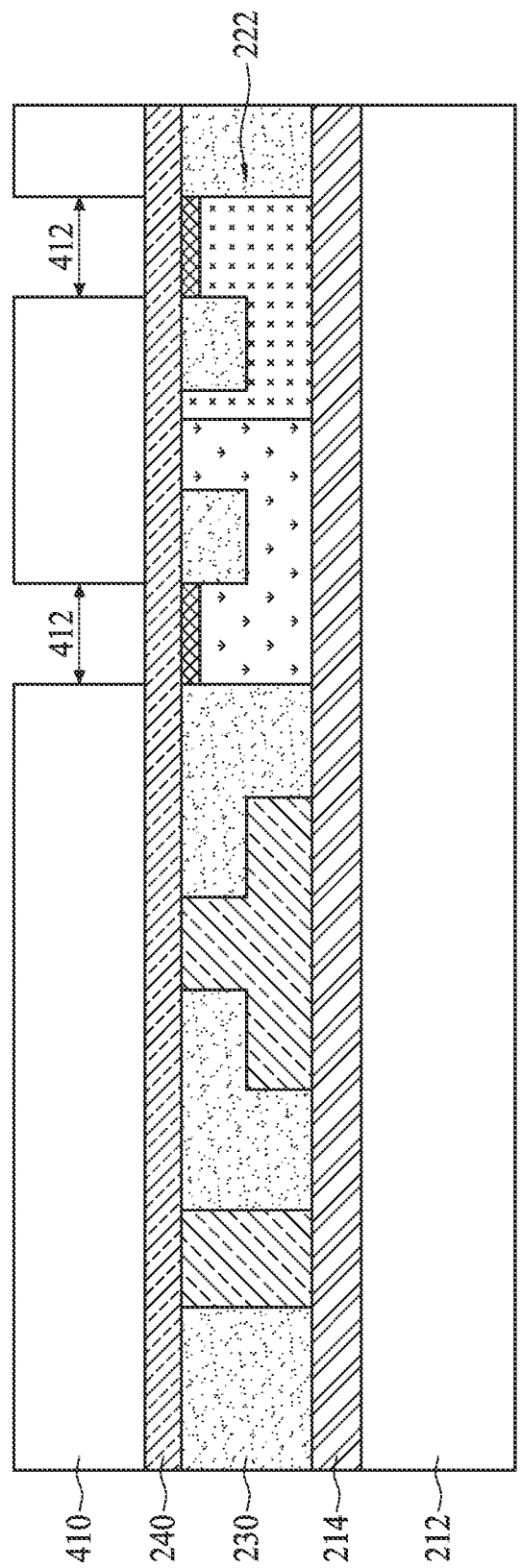

Referring to FIG. 13, a dielectric film 240 is formed on the protection layer 230 and the optical components 218 including the modulator 222 according to a step S510 in FIG. 7. The dielectric film 240, including oxide, may be formed by a CVD operation or other suitable methods. After the formation of the dielectric film 240, the dielectric film 240 may be planarized, using, for example, a CMP operation, to yield an acceptably flat topology.

After the formation of the dielectric film 240, a first patterned mask 410 is provided on the dielectric film 240. In some embodiments, photosensitive material is applied to fully cover the dielectric film 240 by a spin-coating operation and then dried using a soft-baking operation, and the first patterned mask 410 is formed by performing an exposure operation and a develop operation on the photosensitive material. It can be seen in FIG. 13 that a plurality of first openings 412 are provided in the first patterned mask 410 above the n+ region 226a and the p+ region 226b.

Figure 14:
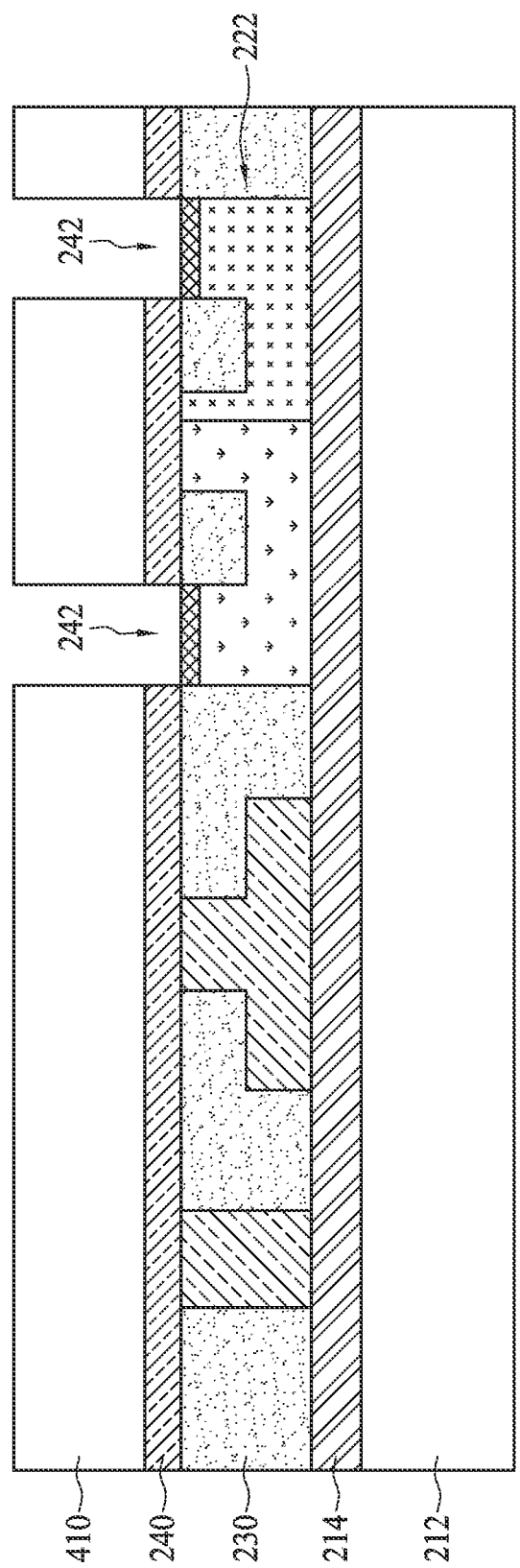

Following the formation of the first patterned mask 410, an etching operation is conducted to remove portions of the dielectric film 240 exposed through the first patterned mask 410, as shown in FIG. 14. Accordingly, a plurality of through holes 242 for exposing the n+ region 226a and the p+ region 226b are formed. In some embodiments, an anisotropic etching operation can be performed to etch portions of the dielectric film 240 that are not masked by the first patterned mask 410. The first patterned mask 410 is then removed using, for example, an ashing operation or a wet strip operation.

Figure 15:
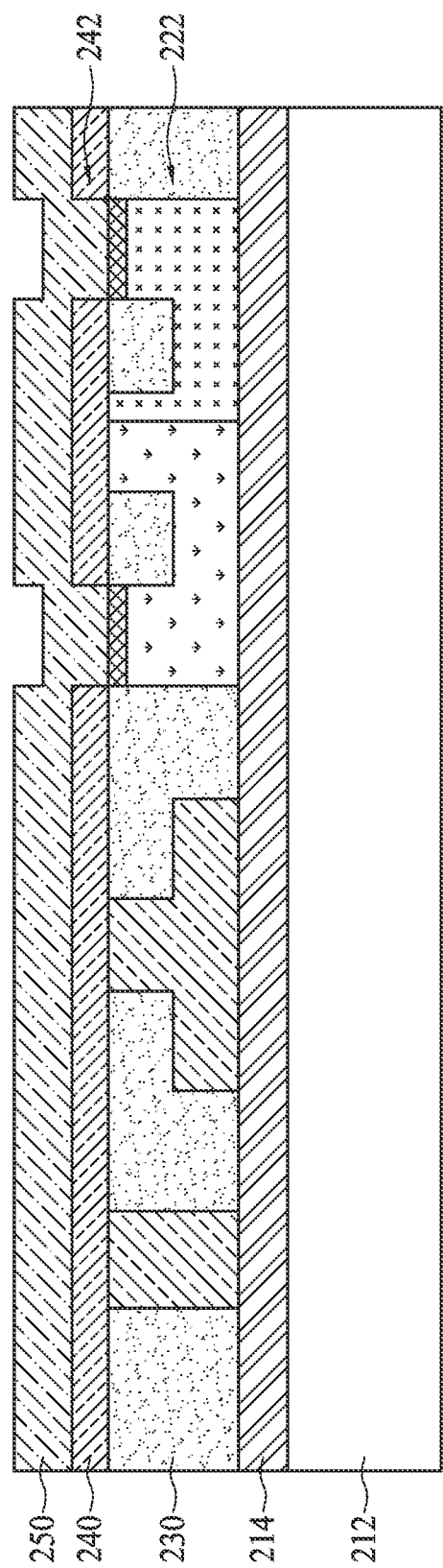
Figure 16:
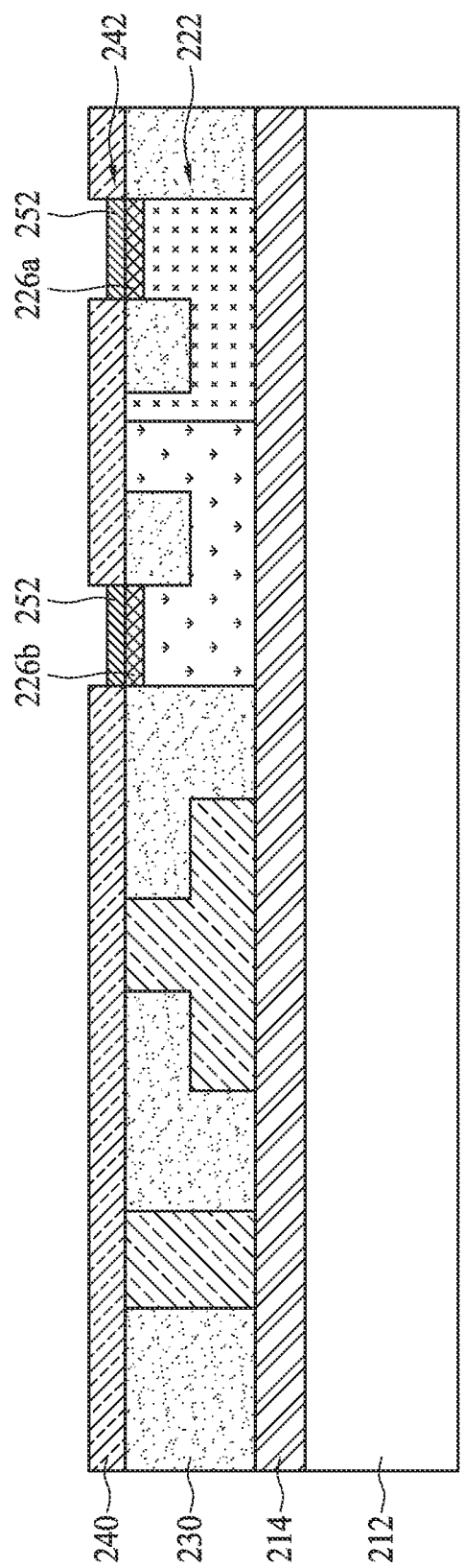

Referring to FIGS. 15 and 16, a plurality of electrodes 252 are formed at top portions of the n+ region 226a and the p+ region 226b according to a step S512 in FIG. 7. As shown in FIG. 15, a metal layer 250 is formed at least on the n+ region 226a and the p+ region 226b. In some embodiments, the metal layer 250 is deposited across the dielectric film 240 conforming to a surface topography of the etched dielectric film 240 and the n+ region 226a and the p+ region 226b exposed through the openings 242 in the dielectric film 240 (as shown in FIG. 14). The metal layer 250 can include, and/or can consist essentially of, at least one metal that can form a metal silicide material. For example, the metal layer 250 can include nickel.

In some embodiments, a thermal anneal operation can be performed at an elevated temperature to cause a reaction between the metal layer 250 and a semiconductor material of the modulator 222. After the anneal operation, a plurality of metal-semiconductor alloy portions are formed. The metal-semiconductor alloy portions act as electrodes of the modulator 222. The reacted portions of the metal layer 250 and a silicon material of the modulator 222 form the electrodes 252, as shown in FIG. 16. Unreacted portions of the metal layer 250 can be subsequently removed. For example, the unreacted portion of the metal layer 250 can be etched selectively to metal-semiconductor alloy portions using a wet etching operation.

Figure 17:
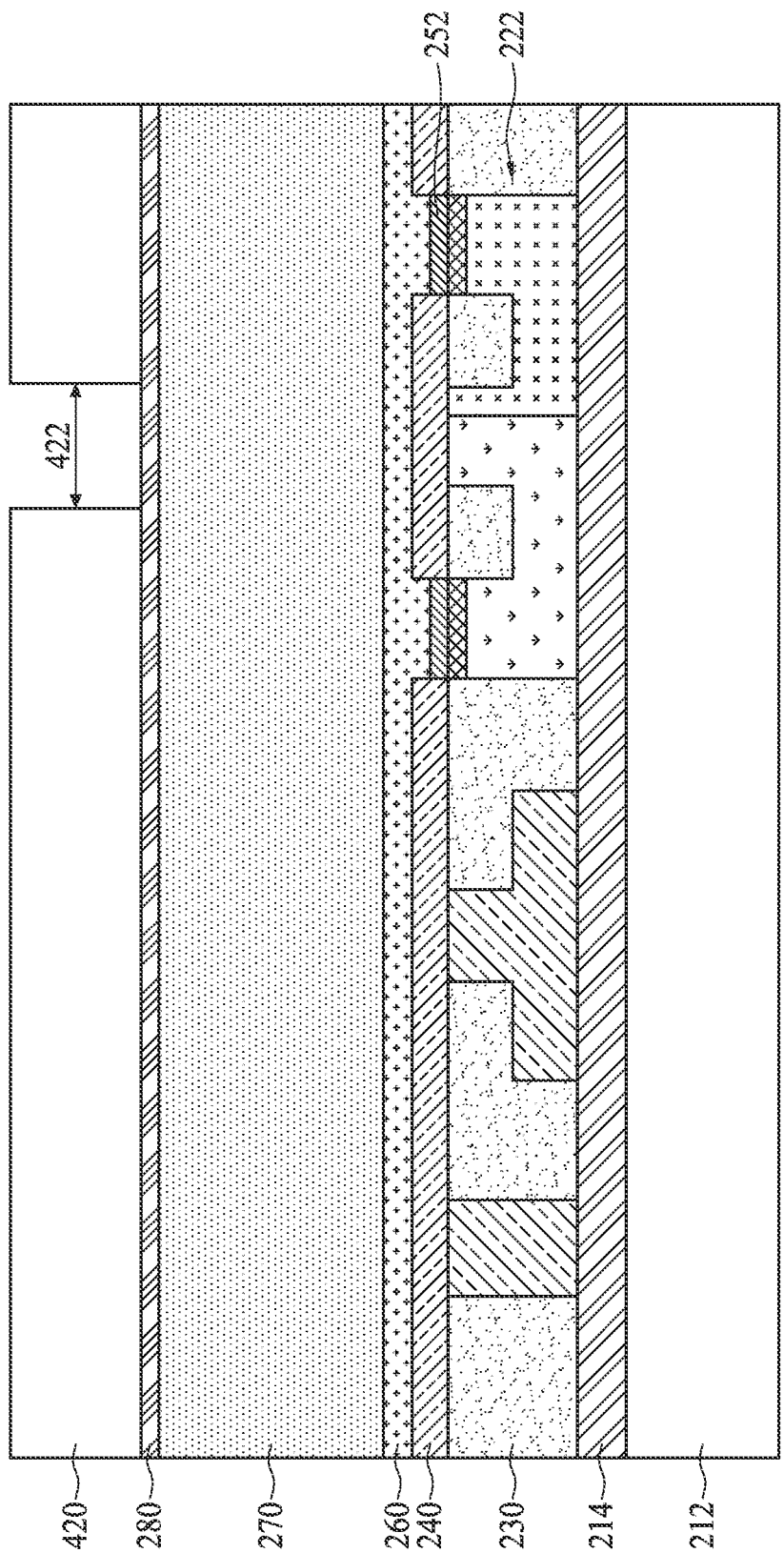

Referring to FIG. 17, a contact etch stop layer (CESL) 260 and an interlayer dielectric (ILD) layer 270 are successively formed over the dielectric film 240 and the electrodes 252 of the modulator 222 according to a step S514 in FIG. 7. The CESL 260 may comprise one or more layers of silicon oxide or silicon nitride-based materials such as SiN, SiCN, SiON or SiOCN. The CESL 260 may be formed by a CVD operation, a physical vapor deposition (PVD) operation, an atomic layer deposition (ALD) operation and/or other suitable methods. The ILD layer 270, disposed on the CESL 260, may include $SiO_2$, SiN, SiON, SiOCN, fluorine-doped silicate glass (FSG), or a low-K dielectric material, and may be formed by CVD or other suitable operations. A CMP operation may follow the forming of the ILD layer 270 to remove excessive dielectric material, and thereby provide a substantially planar top surface.

FIG. 17 further illustrates an anti-reflective coating (ARC) layer 280 and a second patterned mask 420 over the ILD layer 270. The ARC layer 280 is disposed on the ILD layer 270. Anti-reflective coating may improve photo resolution by reducing optical distortions associated with specular reflections, thin-film interference, and/or standing waves that may inhibit sharp feature definition during imaging of the photoresist material. In the illustrated example, the ARC layer 280 may include SiON. The ARC layer 280 may be formed by any suitable deposition technique, e.g., CVD, PECVD, ALD, PEALD. PVD, spin-coating or the like, or a combination thereof. The second patterned mask 420 includes a second opening 422 above the modulator 222. The second patterned mask 420 may be formed by steps including: conformally coating a photosensitive material on the ARC layer 280, exposing portions of the photosensitive material to radiation (not shown), and developing the photosensitive material, thereby forming the second opening 422 defining a pattern for etching of the ARC layer 280 and the ILD layer 270.

Figure 18:
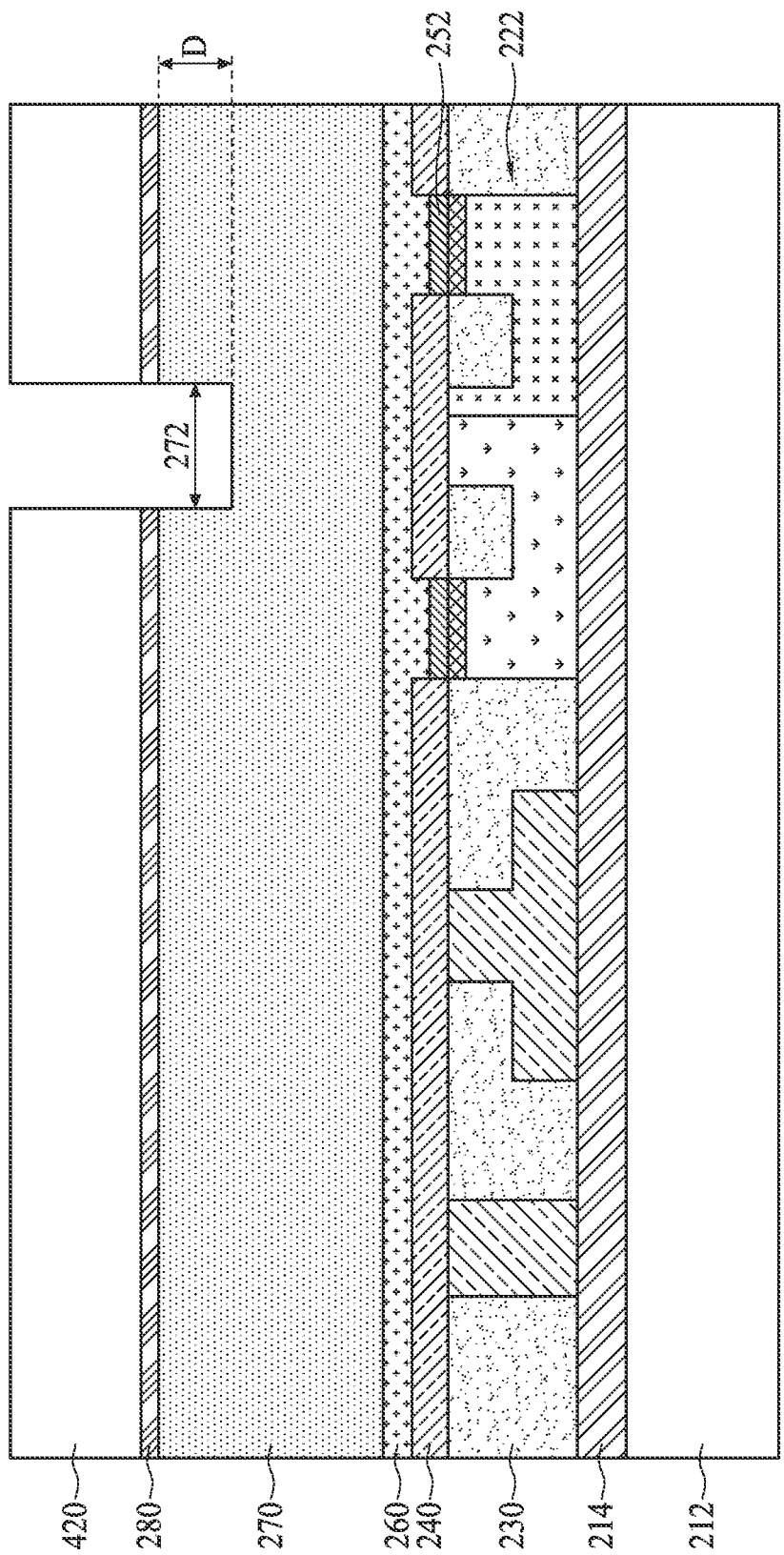

Referring to FIG. 18, one or more etching operations are performed to form a trench 272 in the ILD layer 270 according to a step S516 in FIG. 7. The one or more etching operations are performed in order to remove portions of the ARC layer 280 not masked by the second patterned mask 420, and portions of the ILD layer 270 exposed after removing the unmasked portions of the ARC layer 280, thus forming the trench 272 above the modulator 222 for formation of a thermal tuning member, as described below. Portions of the ARC layer 280 and the ILD layer 270 are removed using one etching operation. The etching operation utilizes multiple etchants, selected based on materials of the ARC layer 280 and the ILD layer 270, to sequentially etch the ARC layer 280 and the ILD layer 270. The etching operation is conducted until the ILD layer 270 is etched to a selected depth D. In some embodiments, the selected depth D is between about 1000 Å and about 4000 Å. After the formation of the trench 272, the second patterned mask 420 is removed by an acceptable ashing or stripping operation.

Figure 19:
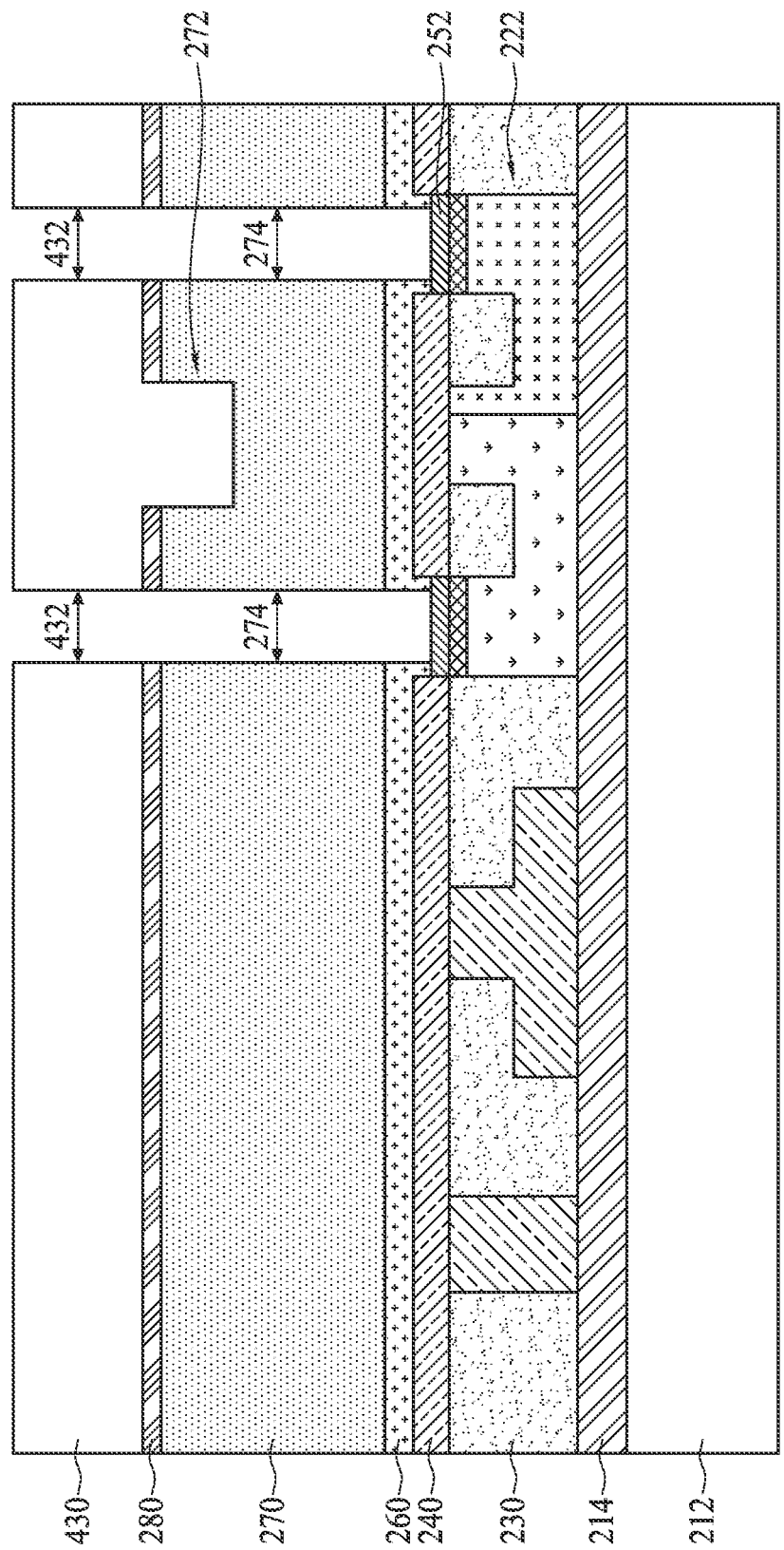

Subsequently, a blanket layer of photosensitive material is formed on the ARC layer 280 and etched portions of the ILD layer 270 and the ARC layer 280. The blanket layer of the photosensitive material is then patterned to provide a third patterned mask 430 (as shown in FIG. 19) having a plurality of third openings 432 utilizing a lithographic operation that may include exposing the photosensitive material to a pattern of radiation and developing the exposed photosensitive material utilizing a developer. The third openings 432 are disposed above the electrodes 252 of the modulator 222.

Still referring to FIG. 19, at least one etching operation is performed to remove portions of the ARC layer 280, the ILD layer 270 and the CESL 260 not protected by the third patterned mask 430 according to step S518 in FIG. 7. Consequently, a plurality of contact holes 274 are formed, and portions of the electrodes 252 are exposed. The contact holes 274, penetrating through the ARC layer 280, the ILD layer 270 and the CESL 260, can be formed using an etching operation utilizing multiple etchants, selected based on materials of the CESL 260, the ILD layer 270, and the ARC layer 280, to sequentially etch the ARC layer 280, the ILD layer 270 and the CESL 260 until the electrodes 252 are exposed. After the contact holes 274 are formed, the third patterned mask 430 is removed using, for example, an ashing operation or a wet strip operation.

Figure 20:
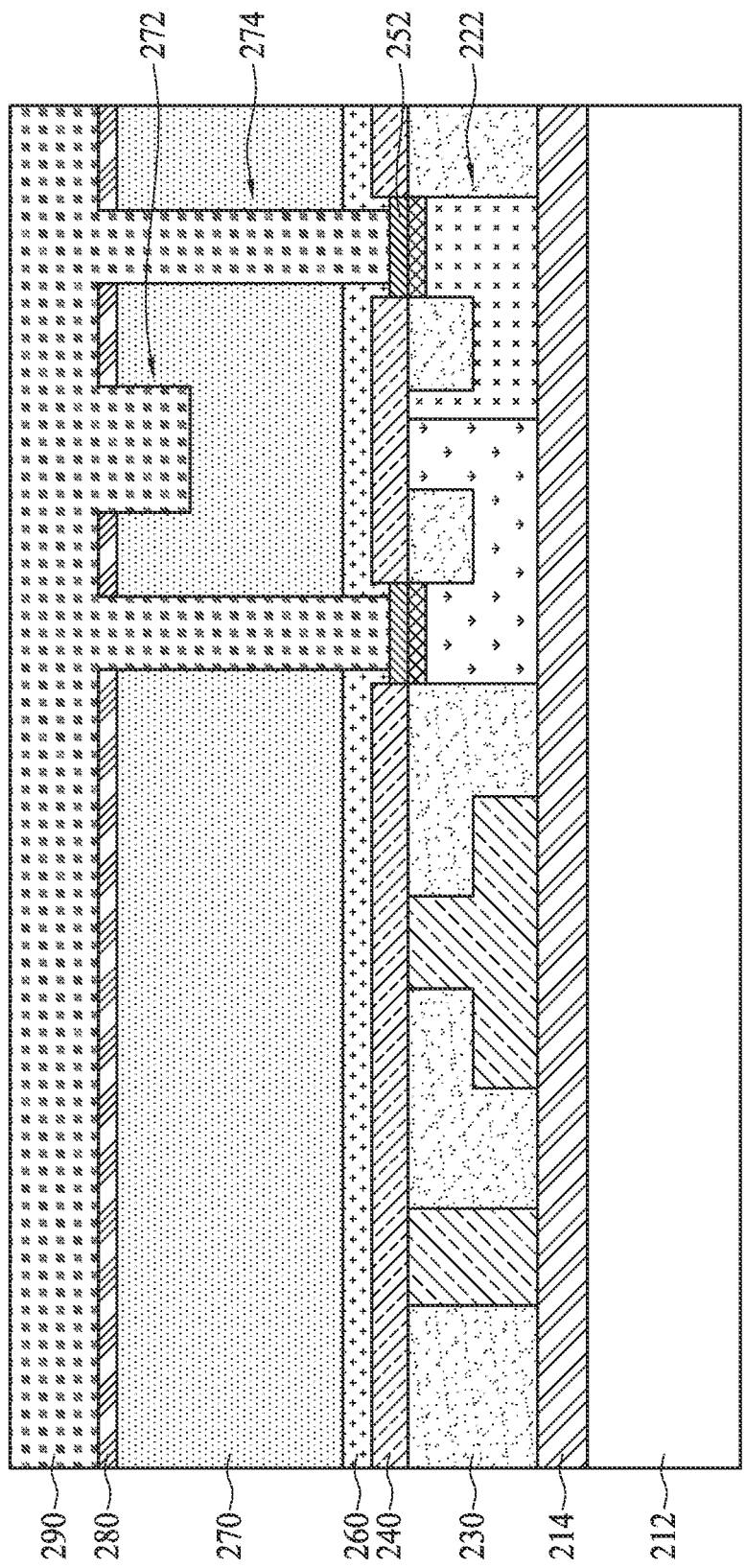

Referring to FIG. 20, a first metallic material 290 is deposited in the trench 272 and the contact holes 274, according to a step S520 in FIG. 7. The first metallic material 290 is uniformly deposited on the electrodes 252 of the modulator 222 and the ARC layer 280 until the trench 272 and the contact holes 274 are entirely filled. The first metallic material 290 may comprise tungsten. The first metallic material 290 may be deposited using a CVD operation.

Figure 21:
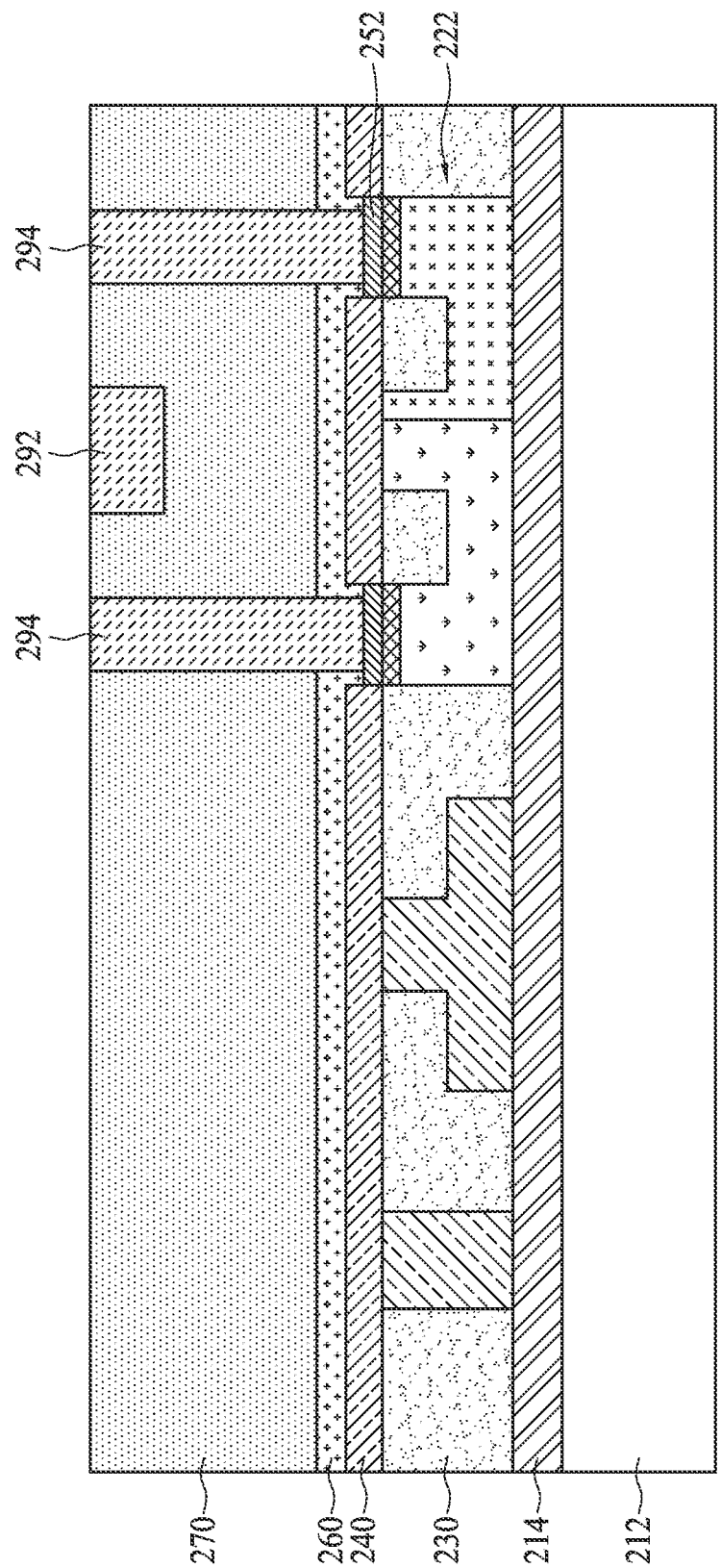

Next, a planarizing operation is performed to remove the first metallic material 290 and the ARC layer 280. Consequently, the thermal tuning member 292 and a plurality of metal plugs 294, as shown in FIG. 21, are formed. After the removal of the superfluous first metallic material 290 and the ARC layer 280, the ILD layer 270 is exposed. The thermal tuning member 292 in the ILD layer 270 may have a structure as shown in FIGS. 3, 5 and 6.

Referring to FIG. 22 to FIG. 26, a back-end-line (BEOL) layer 300 is formed over the ILD layer 270, the thermal tuning member 292 and the conductive plugs 294 according to a step S522 in FIG. 7. The BEOL layer 300 includes a plurality of layers comprising an insulative layer 310 and a plurality of metallization layers 320 stacked within the insulative layer 310. The BEOL layer 300 is formed utilizing a cyclic operation comprising a sequence of depositing a dielectric layer and forming metallization lines penetrating through the dielectric layer.

Figure 22:
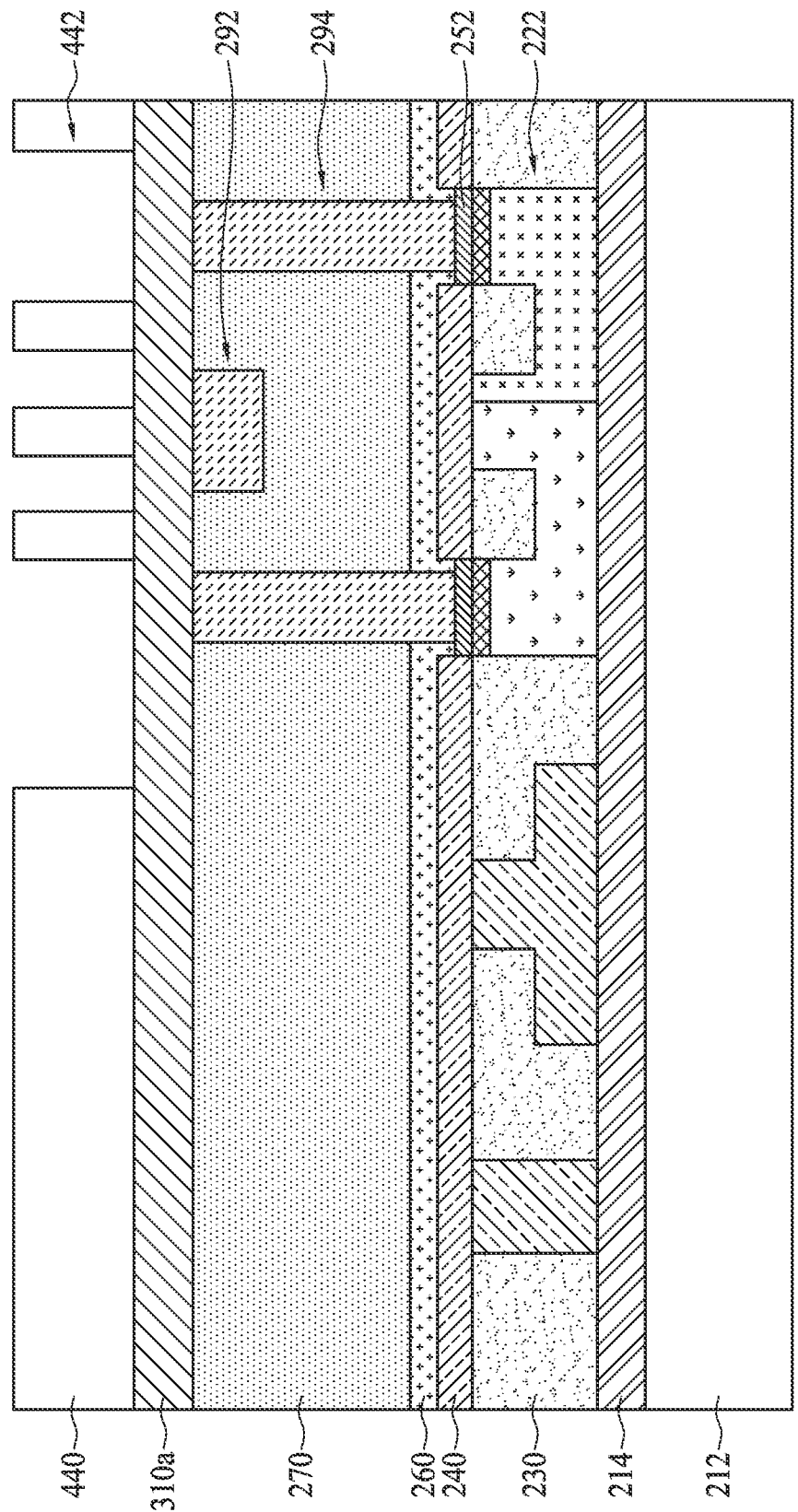

Referring to FIG. 22, a first dielectric layer 310a, including oxide, is formed using a CVD operation. After the formation of the first dielectric layer 310a, a planarization operation may be performed to provide the first dielectric layer 310a with a substantially planar top surface. Next, a fourth patterned mask 440, including a plurality of fourth openings 442, is provided on the first dielectric layer 310a. The openings 442 may be formed in the fourth patterned mask 440 using lithography operations.

Figure 23:
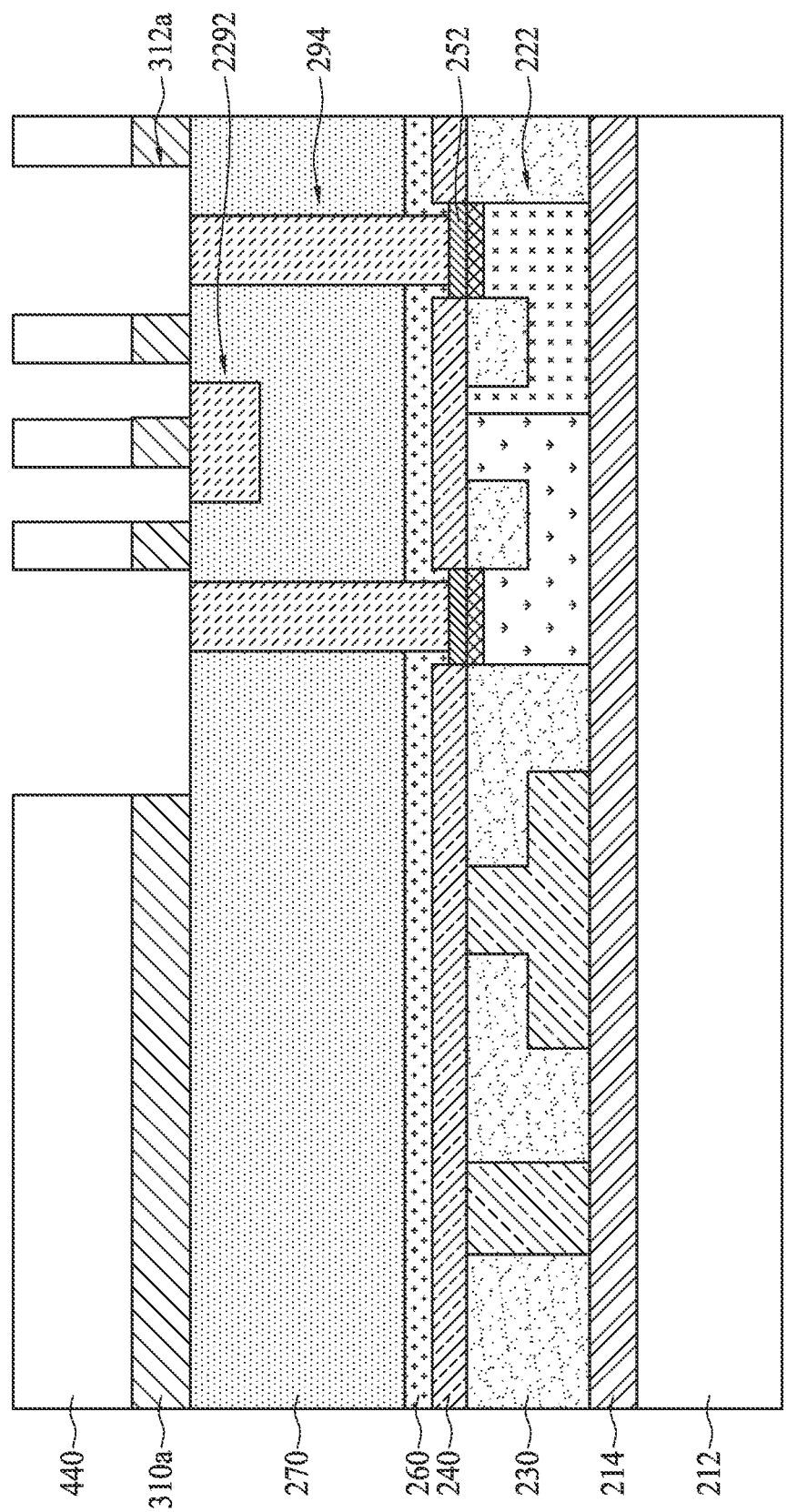

Next, an etching operation is performed to remove portions of the first dielectric layer 310a not protected by the fourth patterned mask 440. After the etching operation, a plurality of holes penetrating through the first dielectric layer 310a are formed, and portions of the thermal tuning member 292 and the plugs 294 are exposed through the holes 312a, as shown in FIG. 23.

Figure 24:
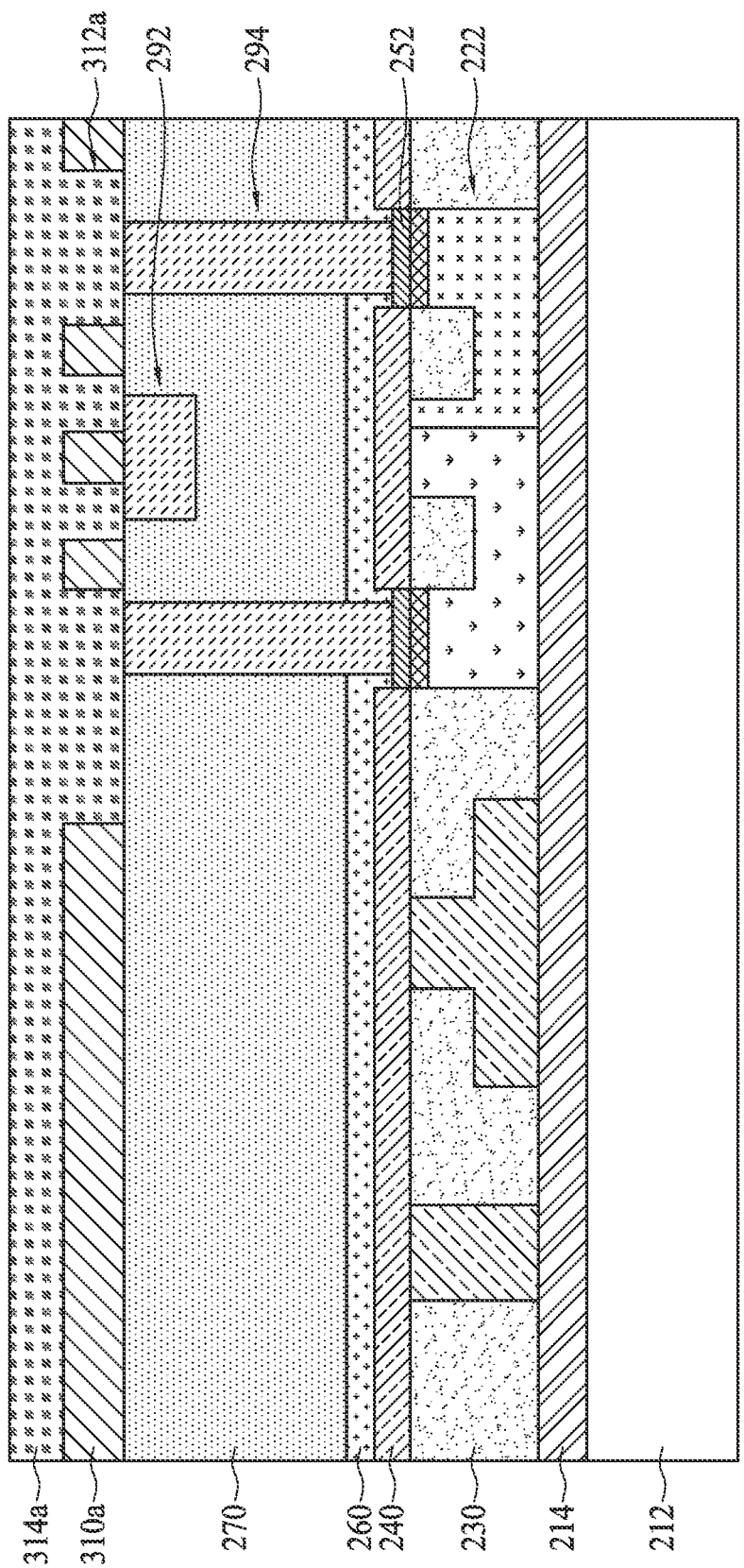
Figure 25:
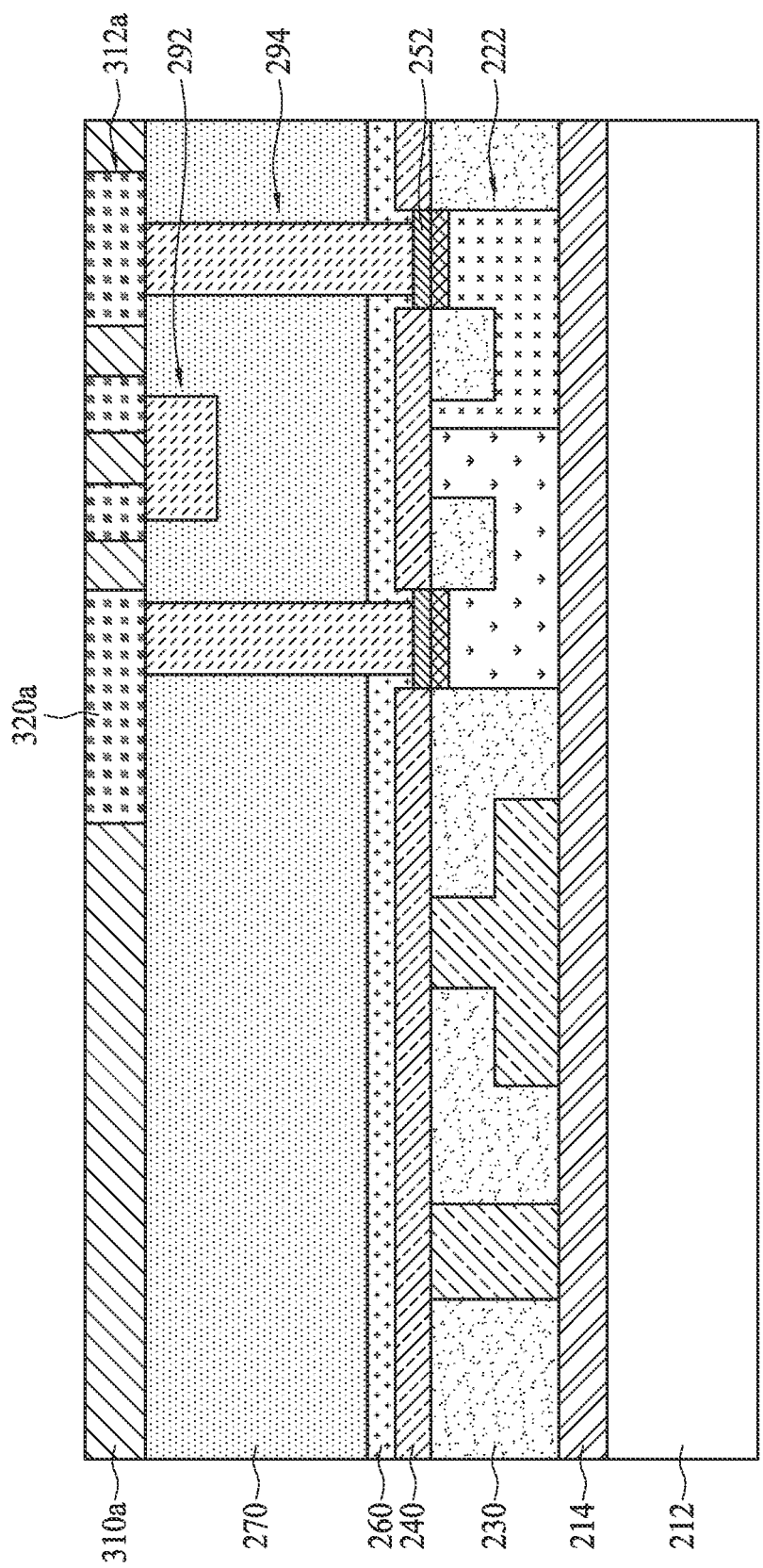
Figure 26:
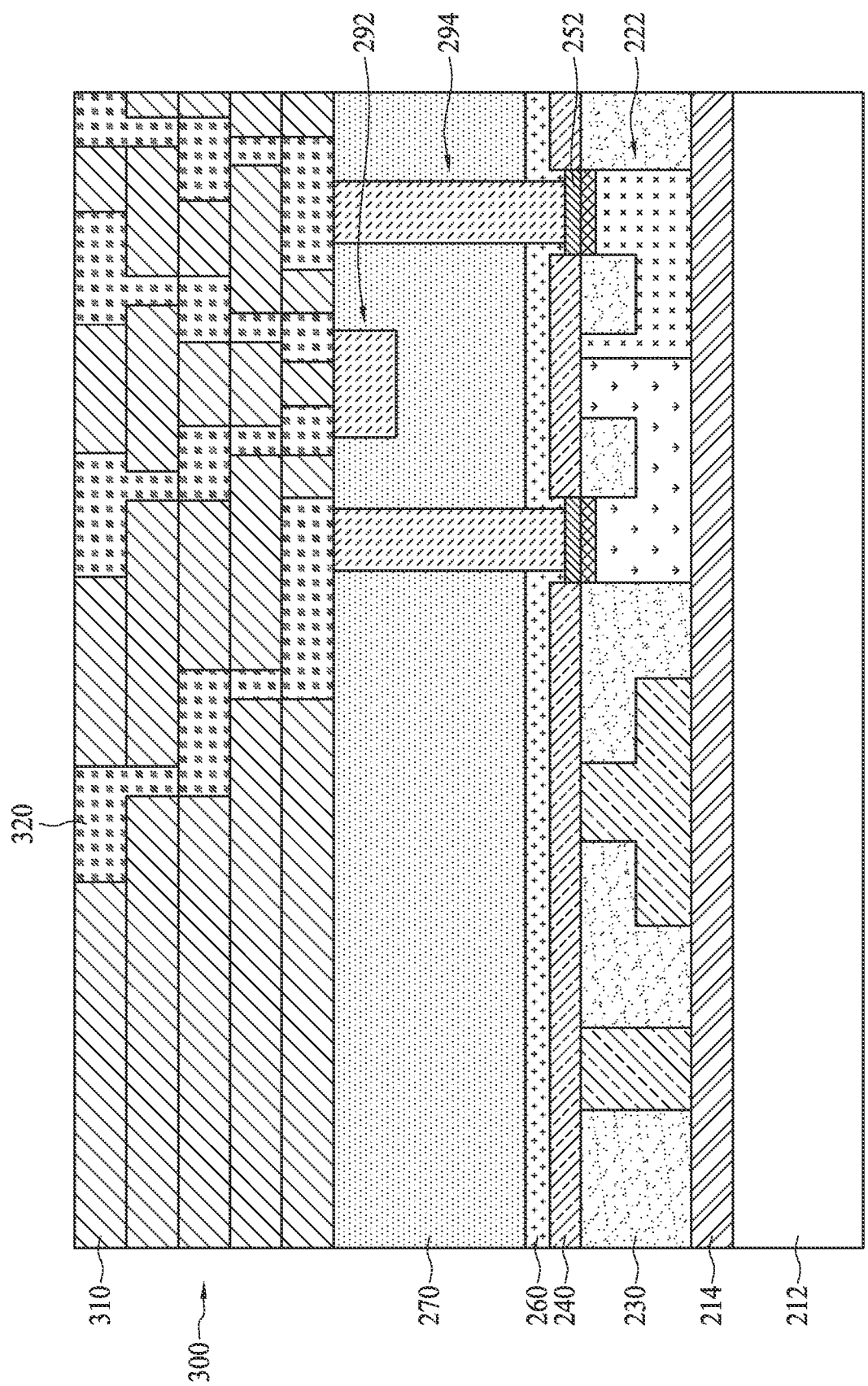

Subsequently, a second metallic material 314a (as shown in FIG. 24) is formed over the first dielectric layer 310a, the thermal tuning member 292 and the plugs 294. In some embodiments, the formation of the second metallic material 314a includes filling the holes 312a with the second metallic material 314a, and the filling of the holes 312a may include a plating operation. In some embodiments, after the plating operation is performed, the second metallic material 314a may overflow the holes 312a and cover a top surface of the first dielectric layer 310a; accordingly, an additional planarization may be performed to remove an overflow portion of the second metallic material 314a. As shown in FIG. 25, first metallization lines 320a are thus formed to couple to the thermal tuning member 292 and the conductive plugs 294. In some embodiments, after the formation of the first metallization lines 320a, a series of metal damascene processes used to form other metallization lines coupled to the first metallization lines 320a are performed until the BEOL layer 300 are completely formed.

In accordance with some embodiments of the present disclosure, a method of fabricating an optical device comprises steps of: receiving a substrate; forming a silicon-based optical component in the substrate; depositing an interlayer dielectric (ILD) layer on the substrate and the silicon-based optical component; forming a thermal tuning member comprising a first metallic material in the ILD layer, wherein the thermal tuning member comprises a core above the silicon-based optical component, a plurality of grids spaced apart from the core, and a pair of neck portions connecting the plurality of grids to the core, wherein a width of a strip in each of the plurality of grids is greater than a width of the core; forming at least one conductive plug comprising the first metallic material penetrating through the ILD layer and coupled to the silicon-based optical component; forming a dielectric layer over the thermal tuning member and the conductive plug; and forming a plurality of conductive lines comprising a second metallic material coupled to the thermal tuning member.

In accordance with some embodiments of the present disclosure, a method of fabricating a thermal tuning member for a silicon-based optical component is provided. The method comprises steps of: forming a core above the silicon-based optical component; forming a pair of neck portions connected to the core; forming a plurality of strips adjacent to the pair of neck portions, the plurality of strips being equally spaced and parallel to one another; and forming a plurality of connecting portions to connect the strips to the pair of neck portions.

In accordance with some embodiments of the present disclosure, a silicon-based optical device includes: a silicon-on-insulator (SOI) substrate; at least one optical component formed within the SOI substrate; a thermal tuning member disposed over the optical components and comprising a core, a pair of neck portions connected to the core, and a plurality of grids connected to the pair of neck portions, wherein the plurality of grids each comprises a plurality of strips equally spaced and parallel to one another; and a connecting portion connecting the plurality of strips to the pair of neck portions.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating an optical device, comprising:
receiving a substrate;
forming a silicon-based optical component in the substrate;
depositing an interlayer dielectric (ILD) layer on the substrate and the silicon-based optical component;
forming a thermal tuning member comprising a first metallic material in the ILD layer and above the silicon-based optical component, wherein the thermal tuning member comprises a core above the silicon-based optical component, a plurality of grids spaced apart from the core, and a pair of neck portions connecting the plurality of grids to the core, wherein a width of a strip in each of the plurality of grids is greater than a width of the core;
forming at least one conductive plug comprising the first metallic material penetrating the ILD layer and coupled to the silicon-based optical component;
forming a dielectric layer over the thermal tuning member and the conductive plug; and
forming a plurality of conductive lines comprising a second metallic material coupled to the thermal tuning member.

2. The method of claim 1, wherein the first metallic material has a first melting temperature, and the second metallic material has a second melting temperature less than the first melting temperature.

3. The method of claim 1, wherein each of the plurality of grids comprises:
a plurality of strips, equally spaced and parallel to one another; and
a connecting portion connecting the strips to one of the neck portions;
wherein the core, the pair of neck portions, the connecting portion, and the plurality of strips have a substantially same thickness.

4. The method of claim 1, wherein the core has a first width, the pair of neck portions have a second width greater than the first width, and the plurality of strips and the connecting portions have a third width greater than the second width.

5. The method of claim 1, wherein when viewed from above, the core overlaps the silicon-based optical component.

6. The method of claim 1, wherein the formation of the thermal tuning member comprises:
forming a trench in the ILD layer; and
depositing the first metallic material in the trench.

7. The method of claim 6, wherein the formation of the conductive plug comprises:
forming at least one contact hole penetrating the ILD layer such that at least one portion of the silicon-based optical device is exposed; and
depositing the first metallic material in the contact hole, wherein the deposition of the first metallic material in the trench and the deposition of the first metallic material in the contact hole are performed simultaneously.

8. The method of claim 7, wherein the trench is formed in the ILD layer prior to the formation of the contact hole.

9. A method of fabricating a thermal tuning member for a silicon-based optical component, comprising:
forming a core above the silicon-based optical component;
forming a pair of neck portions connected to the core;
forming a plurality of strips adjacent to the pair of neck portions, the plurality of strips being equally spaced and parallel to one another; and
forming a plurality of connecting portions to connect the strips to the pair of neck portions.

10. The method of claim 9, wherein the core overlaps the silicon-based optical component when viewed from above.

11. The method of claim 9, wherein the plurality of strips extend parallel to the pair of neck portions.

12. The method of claim 9, wherein the plurality of strips connected to one of the neck portions comprise an odd number of strips with decreasing lengths from a center toward two sides.

13. The method of claim 9, wherein the core has a first width, the pair of neck portions have a second width greater than the first width, and the plurality of strips have a third width greater than the second width.

14. The method of claim 9, wherein the plurality of strips and the pair of neck portions are arranged symmetrically with respect to a central line of the core.

15. A silicon-based optical device, comprising:
- a silicon-on-insulator (SOI) substrate;
- at least one optical component formed within the SOI substrate; and
- a thermal tuning member disposed over the optical components and comprising:
  - a core;
  - a pair of neck portions connected to the core; and
  - a plurality of grids connected to the pair of neck portions, wherein each of the plurality of grids comprises:
    - a plurality of strips, equally spaced and parallel to one another; and
    - a connecting portion connecting the plurality of strips to the pair of neck portions.

16. The silicon-based optical device of claim 15, wherein the plurality of grids each comprises an odd number of strips having decreasing lengths from a center toward two sides.

17. The silicon-based optical device of claim 15, further comprising:
- a back-end-of-line (BEOL) stack disposed over the optical component and the thermal tuning member and comprising an interlayer dielectric (ILD) layer and a plurality of metallization layers stacked within the ILD layer, wherein one of the metallization layers closest to the thermal tuning member comprises a plurality of conductive lines coupled to the plurality of strips of each grid; and
- at least one conductive plug extending vertically from the optical components toward the BEOL stack,
- wherein each of the conductive lines extends perpendicular to the plurality of the strips being connected.

18. The silicon-based optical device of claim 17, wherein the thermal tuning member and the conductive plug comprise a same material having a first melting temperature, and the metallization layers have a second melting temperature less than the first melting temperature.

19. The silicon-based optical device of claim 15, further comprising an insulative layer disposed on the SOI substrate and the optical component, wherein the thermal tuning member is disposed in the insulative layer and the core is directly above the optical component.

20. The silicon-based optical device of claim 15, wherein when viewed from above, the optical component is of a ring shape, and the core is of a ring shape or a C shape.

* * * * *